(12) United States Patent
Chen et al.

(10) Patent No.: US 11,031,354 B2
(45) Date of Patent: Jun. 8, 2021

(54) MIXING ORGANIC MATERIALS INTO HYBRID PACKAGES

(71) Applicant: Taiwan Semiconductor Manufacturing Company, Ltd., Hsinchu (TW)

(72) Inventors: Ming-Fa Chen, Taichung (TW); Hsien-Wei Chen, Hsinchu (TW); Chih-Chia Hu, Taipei (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/569,731

(22) Filed: Sep. 13, 2019

(65) Prior Publication Data

US 2020/0006254 A1    Jan. 2, 2020

Related U.S. Application Data

(62) Division of application No. 15/966,630, filed on Apr. 30, 2018.

(51) Int. Cl.
*H01L 23/00* (2006.01)
*H01L 23/538* (2006.01)
(Continued)

(52) U.S. Cl.
CPC .......... *H01L 23/562* (2013.01); *H01L 21/486* (2013.01); *H01L 21/4853* (2013.01); *H01L 21/4857* (2013.01); *H01L 21/565* (2013.01); *H01L 21/568* (2013.01); *H01L 21/78* (2013.01); *H01L 23/3135* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 25/105* (2013.01); *H01L 25/50* (2013.01); *H01L 2224/214* (2013.01); (Continued)

(58) Field of Classification Search
None
See application file for complete search history.

(56) References Cited

U.S. PATENT DOCUMENTS 7,812,459 B2   10/2010   Yu et al.
9,524,959 B1   12/2016   Yeh et al.
(Continued)

FOREIGN PATENT DOCUMENTS

TW   201719837 A   6/2017

*Primary Examiner* — Nishath Yasmeen
(74) *Attorney, Agent, or Firm* — Slater Matsil, LLP

(57) ABSTRACT

A method includes forming an interposer, which includes a semiconductor substrate, and an interconnect structure over the semiconductor substrate. The method further includes bonding a device die to the interposer, so that a first metal pad in the interposer is bonded to a second metal pad in the device die, and a first surface dielectric layer in the interposer is bonded to a second surface dielectric layer in the device die. The method further includes encapsulating the device die in an encapsulating material, forming conductive features over and electrically coupling to the device die, and removing the semiconductor substrate. A part of the interposer, the device die, and portions of the conductive features in combination form a package.

20 Claims, 22 Drawing Sheets

(51) Int. Cl.
*H01L 21/48* (2006.01)
*H01L 21/56* (2006.01)
*H01L 21/78* (2006.01)
*H01L 25/10* (2006.01)
*H01L 25/00* (2006.01)
*H01L 23/31* (2006.01)

(52) U.S. Cl.
CPC ............... *H01L 2225/1035* (2013.01); *H01L 2225/1058* (2013.01); *H01L 2924/3511* (2013.01)

(56) References Cited

U.S. PATENT DOCUMENTS

| | | |
|---|---|---|
| 9,852,976 B2 | 12/2017 | Kelly et al. |
| 2007/0231966 A1* | 10/2007 | Egawa ............... H01L 21/76898 438/114 |
| 2011/0026232 A1 | 2/2011 | Lin et al. |
| 2013/0069239 A1 | 3/2013 | Kim et al. |
| 2013/0309813 A1 | 11/2013 | Shih et al. |
| 2014/0319661 A1 | 10/2014 | Pagaila |
| 2015/0179570 A1* | 6/2015 | Marimuthu ......... H01L 25/0655 257/774 |
| 2015/0259194 A1* | 9/2015 | Lin ......................... H01L 24/19 257/773 |
| 2015/0262909 A1* | 9/2015 | Chen ....................... H01L 24/19 257/774 |
| 2015/0270247 A1 | 9/2015 | Chen et al. |
| 2016/0056057 A1* | 2/2016 | Yu ....................... H01L 23/5389 257/774 |
| 2017/0110413 A1 | 4/2017 | Chen et al. |
| 2017/0117253 A1* | 4/2017 | Yu .......................... H01L 24/25 |

* cited by examiner

MIXING ORGANIC MATERIALS INTO HYBRID PACKAGES

PRIORITY CLAIM AND CROSS-REFERENCE

This application is a divisional of U.S. patent application Ser. No. 15/966,630, entitled "Mixing Organic Materials into Hybrid Packages," filed on Apr. 30, 2018, which application is incorporated herein by reference.

BACKGROUND

The packages of integrated circuits are becoming increasing complex, with more device dies integrated in the same package to achieve more functions. For example, System-on-Integrated-Chips (SoIC) have been developed to include a plurality of device dies such as processors and memory cubes in the same package. The SoIC can bond device dies formed using different technologies and have different functions to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
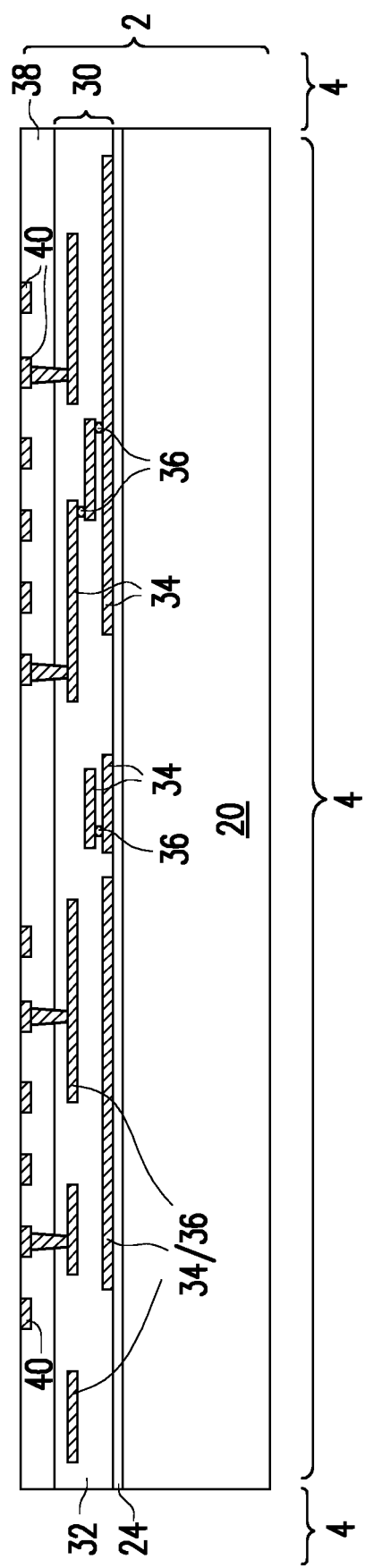
FIGS. 1 through 6 are cross-sectional views of intermediate stages in the formation of a System-on-Integrated-Chip-Horizontal (SoIC-H) package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various embodiments. The intermediate stages of forming the package are illustrated in accordance with some embodiments. Some variations of some embodiments are discussed. Throughout the various views and illustrative embodiments, like reference numbers are used to designate like elements. It is appreciated that although the formation of System-on-Integrated-Chips-Horizontal (SoIC-H) packages is used as examples to explain the concept of the embodiments of the present disclosure, the embodiments of the present disclosure are readily applicable to other packages.

FIG. 1 illustrates the cross-sectional view of an initial structure in the formation of wafer 2. In accordance with some embodiments of the present disclosure, wafer 2 is an interposer wafer, which is free from active devices such as transistors and/or diodes. Interposer wafer 2 may be free from passive devices such as capacitors, inductors, resistors, or the like, or may include passive devices. Interposer wafer 2 may include a plurality of chips 4 therein, with some details of one of chips 4 illustrated. Chip 4 is alternatively referred to as a die hereinafter.

In accordance with some embodiments of the present disclosure, wafer 2 includes semiconductor substrate 20 and the features formed over semiconductor substrate 20. Semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Substrate 20 may also be formed of other rigid materials such as glass, silicon oxide, silicon carbide, or the like. When formed of a semiconductor, substrate 20 may also be a bulk silicon substrate.

Dielectric layer 24 is formed over semiconductor substrate 20. In accordance with some embodiments of the present disclosure, dielectric layer 24 is formed of silicon oxide, silicon nitride, silicon carbide, silicon oxynitride, silicon oxy-carbide, or the like. In accordance with some embodiments dielectric layer 24 is formed of silicon oxide, a thermal oxidation may be performed on substrate 20 to form oxide layer 24.

Figure 14:
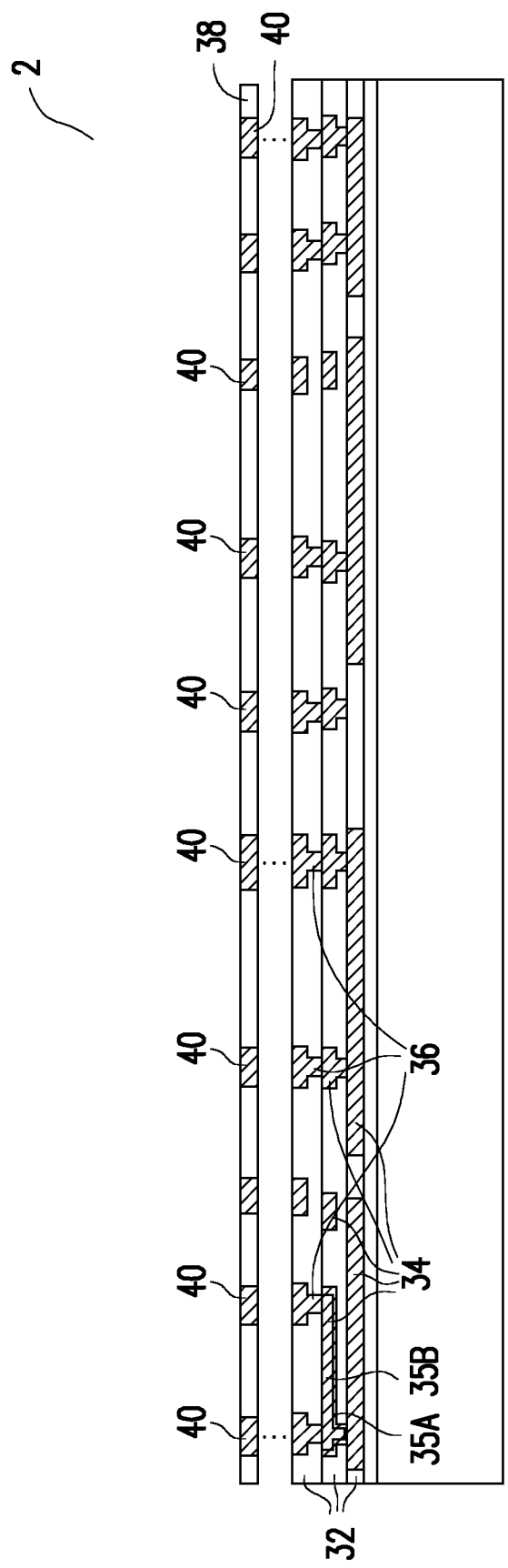
FIG. 14 illustrates some details of dielectric layers, metal lines, and vias of a package in accordance with some embodiment.

Over dielectric layer 24 resides interconnect structure 30, which includes dielectric layers 32 and metal lines/vias 34/36. FIG. 1 illustrates metal lines 34 and vias 36 schematically, and FIG. 14 illustrates some details of the dielectric layers 32, metal lines 34, and vias 36 in accordance with some embodiments. As shown in FIG. 14, interconnect structure 30 includes metal lines 34 and vias 36, which are formed in dielectric layers 32. Dielectric layers 32 are alternatively referred to as Inter-Metal Dielectric (IMD) layers 32 hereinafter. In accordance with some embodiments of the present disclosure, at least the lower layers of dielectric layers 32 are formed of low-k dielectric materials, which may have dielectric constants (k-value) lower than about 3.0. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 are porous. Etch stop layers (not shown), which may be formed of silicon carbide, silicon nitride, or the like, are formed between IMD layers 32, and are not shown for simplicity.

The metal lines 34 at a same level are collectively referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. The formation process may include single damascene process and dual damascene process. In an example of the single damascene process, a trench is first formed in one of dielectric layers 32, followed by filling the trench with a conductive material. A planarization process such as a Chemical Mechanical Polish (CMP) process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. One of the metal lines 34 and vias 36 are shown in detail in FIG. 14, with the diffusion barrier 35A and the overlying conductive material 35B illustrated as being the example of the conductive material. Diffusion barrier layer 35A may include titanium, titanium nitride, tantalum, tantalum nitride, or the like. Conductive material 35B may be formed of copper or a copper alloy.

Referring back to FIG. 1, die 4/wafer 2 includes surface dielectric layer 38 formed at its top surface. Surface dielectric layer 38 is formed of a non-low-k dielectric material such as silicon oxide. Surface dielectric layer 38 is alternatively referred to as a passivation layer since it has the function of isolating the underlying low-k dielectric layers (if any) from the adverse effect of moisture and detrimental chemicals. Surface dielectric layer 38 may also have a composite structure including more than one layer, which may be formed of silicon oxide, silicon nitride, Undoped Silicate Glass (USG), or the like. Die 4 may also include metal pads such as aluminum or aluminum copper pads, Post-Passivation Interconnect (PPI), or the like, which are not shown for simplicity.

Bond pads 40 are formed in surface dielectric layer 38. In accordance with some embodiments of the present disclosure, bond pads 40 are formed through a single damascene process, and may also include barrier layers and a copper-containing material formed over the respective barrier layers. In accordance with alternative embodiments of the present disclosure, bond pads 40 are formed through a dual damascene process. The top surface dielectric layer 38 and bond pads 40 are planarized so that their top surfaces are coplanar, which may be resulted due to the CMP in the formation of bond pads 40.

Figure 2:
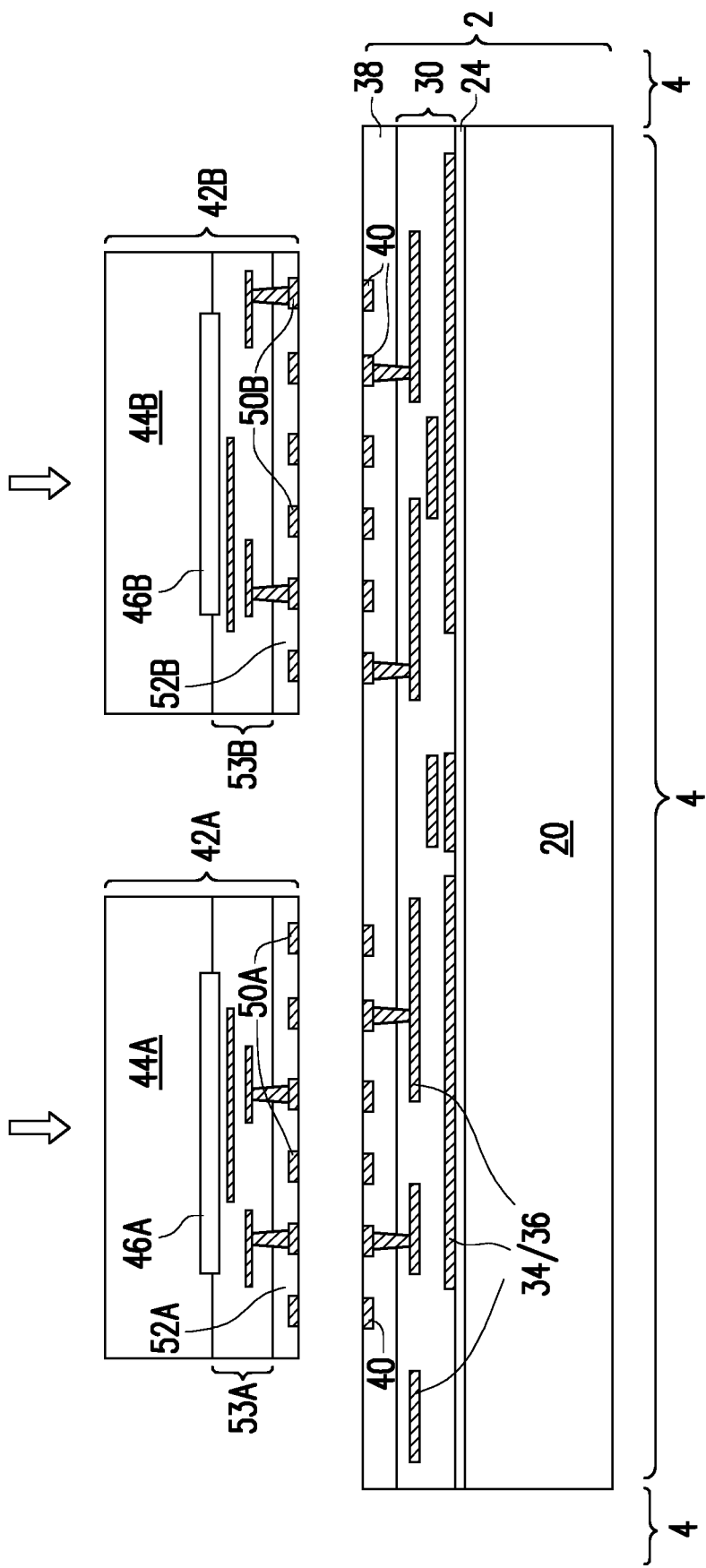
Figure 17:
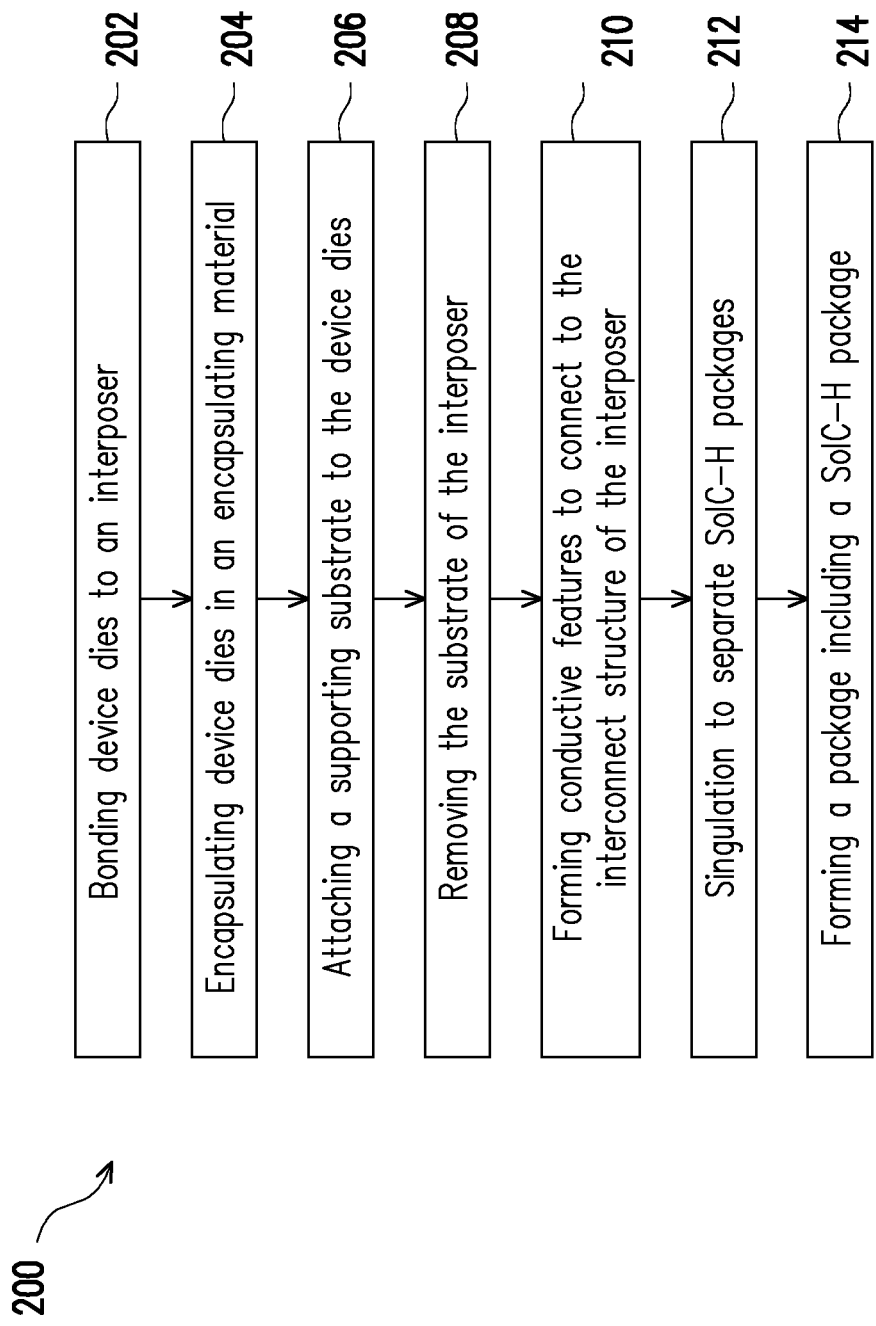
FIG. 17 illustrates a process flow for forming a package in accordance with some embodiments.

Next, device dies 42A and 42B are bonded to wafer 2, as shown in FIG. 2. The respective process is illustrated as process 202 in the process flow 200 as shown in FIG. 17. In accordance with some embodiments of the present disclosure, each of device dies 42A and 42B may be a Central Processing Unit (CPU) die, a Micro Control Unit (MCU) die, an input-output (IO) die, a BaseBand (BB) die, an Application processor (AP) die, or the like. Device dies 42A and 42B may also include memory dies. In addition, device dies 42A and 42B may be different types of dies selected from the above-listed types. Device dies 42A and 42B may be formed using different technologies such as 45 nm technology, 28 nm technology, 20 nm technology, or the like. Also, one of device dies 42A and 42B may be a digital circuit die, while the other may be an analog circuit die. Dies 4, 42A, and 42B in combination function as a system. Splitting the functions and circuits of a system into different dies such as 42A and 42B may optimize the formation of these dies, and may achieve the reduction of manufacturing cost.

Device dies 42A and 42B include semiconductor substrates 44A and 44B, respectively, which may be silicon substrates. Integrated circuit devices 46A and 46B, which may include active devices such as transistors and/or diodes, and passive devices such as capacitors, resistors, or the like are formed in device dies 42A and 42B. Also, device dies 42A and 42B include interconnect structures 53A and 53B, respectively, for connecting to the active devices and passive devices in device dies 42A and 42B. Interconnect structures 53A and 53B include metal lines and vias (not shown).

Die 42A includes bond pads 50A and dielectric layer 52A at the illustrated bottom surface of die 42A. The bottom surfaces of bond pads 50A are coplanar with the bottom surface of dielectric layer 52A. Die 42B includes bond pads 50B and dielectric layer 52B at the illustrated bottom surface. The bottom surfaces of bond pads 50B are coplanar with the bottom surface of dielectric layer 52B. In accordance with some embodiments of the present disclosure, all device dies such as dies 42A and 42B are free from organic dielectric materials such as polymers.

The bonding may be achieved through hybrid bonding. For example, bond pads 50A and 50B are bonded to bond pads 40 through metal-to-metal direct bonding. In accordance with some embodiments of the present disclosure, the metal-to-metal direct bonding includes a copper-to-copper direct bonding. Furthermore, dielectric layers 52A and 52B are bonded to surface dielectric layer 38 through fusion bonding.

To achieve the hybrid bonding, device dies 42A and 42B are first pre-bonded to dielectric layer 38 and bond pads 40 by lightly pressing device dies 42A and 42B against die 4. Although two device dies 42A and 42B are illustrated, the hybrid bonding may be performed at wafer level, and a plurality of device die groups identical to the illustrated die group (which include device dies 42A and 42B) are pre-bonded, and arranged as rows and columns.

After all device dies 42A and 42B are pre-bonded, an anneal is performed to cause the inter-diffusion of the metals in bond pads 40 and the corresponding overlying bond pads 50A and 50B. The annealing temperature may be in the range between about 200° and about 400° C., and may be in the range between about 300° and about 400° C. in accordance with some embodiments. The annealing time may be in the range between about 1.5 hours and about 3.0 hours, and may be in the range between about 1.5 hours and about 2.5 hours in accordance with some embodiments. Through the hybrid bonding, bond pads 50A and 50B are bonded to the corresponding bond pads 40 through direct metal bonding caused by metal inter-diffusion.

Dielectric layer 38 is also bonded to dielectric layers 52A and 52B, with bonds formed therebetween. For example, the atoms (such as oxygen atoms) in one of the dielectric layers 38 and 52A/52B form chemical or covalence bonds with the atoms (such as silicon atoms) in the other one of dielectric layers 38 and 52A/52B. The resulting bonds between dielectric layers 38 and 52A/52B are dielectric-to-dielectric bonds. Bond pads 50A and 50B may have sizes greater than, equal to, or smaller than, the sizes of the respective bond pads 40.

Figure 3:
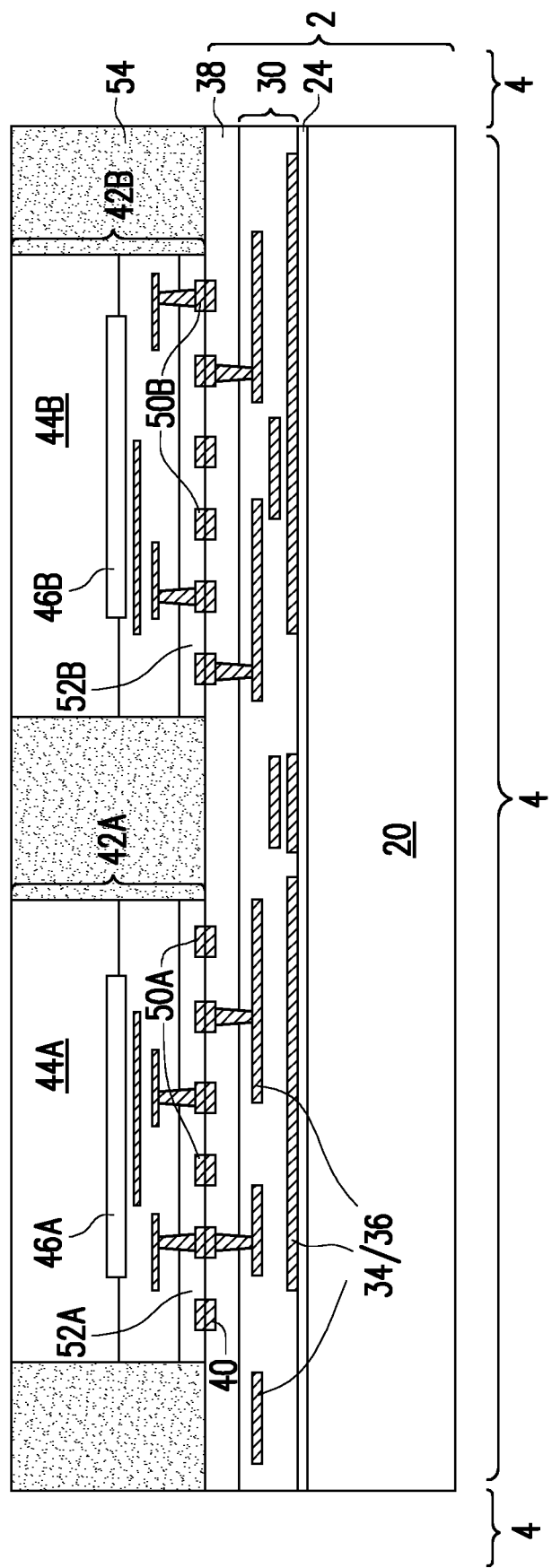
Figure 15:
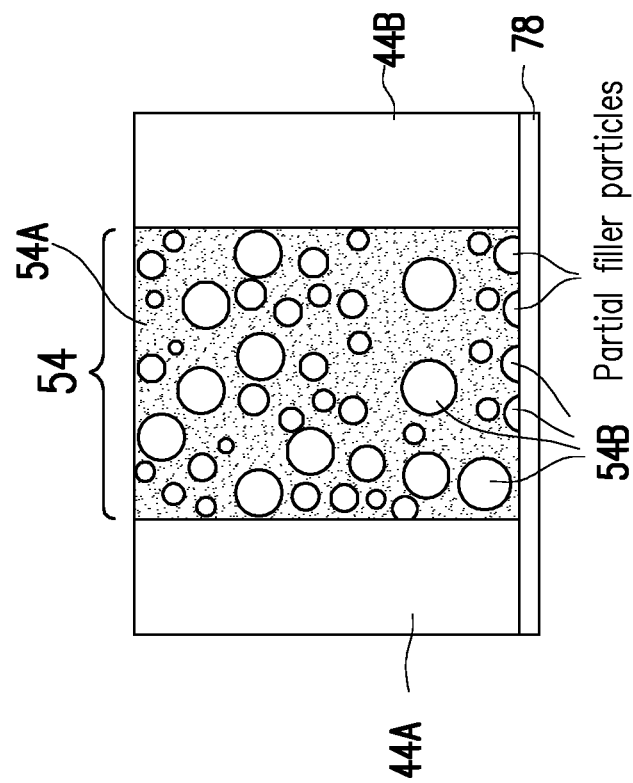

Next, referring to FIG. 3, after the bonding of device dies 42A and 42B to die 4, device dies 40A and 40B are encapsulated in encapsulating material (encapsulant) 54. The respective process is illustrated as process 204 in the process flow 200 as shown in FIG. 17. Encapsulating material 54 may be a molding compound, a molding underfill, an epoxy, and/or a resin. The top surface of encapsulating material 54 is higher than the top surfaces of substrates 44A and 44B. FIG. 15 schematically illustrates some details of encapsulating material 54. Encapsulating material 54 may include base material 54A, which may be a polymer, a resin, an epoxy, or the like, and filler particles 54B in the base material 54A. The base material may be a carbon-based polymer. The filler particles may be the particles of a dielectric material(s) such as $SiO_2$, $Al_2O_3$, silica, the compound of iron (Fe), the compound of sodium (Na), or the like, and may have spherical shapes. Also, the spherical filler particles 54B may have the same or different diameters, as illustrated in FIG. 15 in accordance with some examples.

In a subsequent step, as also shown in FIG. 3, a planarization process such as a Chemical Mechanical Polish (CMP) process or a mechanical grinding process is performed to planarize the top surfaces of device dies 42A and 42B and encapsulating material 54, until substrates 44A and 44B are exposed. Due to the planarization process, some filler particles 54B at the top surface (in FIG. 3) of the molded encapsulating material 54 are polished partially, causing some of the filler particles to have the top portions removed, and bottom portions remaining. The resulting partial filler particles will thus have top surfaces to be planar, which planar top surfaces are coplanar with the top surface of base material 54A and substrates 44A and 44B of device dies 42A and 42B, respectively.

In accordance with some embodiments of the present disclosure, device dies 42A and 42B are not thinned before device dies 42A and 42B are encapsulated in encapsulating material 54. Also, during the planarization process performed after the encapsulating material 54 is applied, the planarization is not performed excessively in the planarization of encapsulating material 54. Rather, the planarization is stopped as soon as both substrates 44A and 44B are exposed. Accordingly, the thicknesses of device dies 42A and 42B are preserved, and device dies 42A and 42B and encapsulating material 54 are thick enough to be used as a supporting structure for the subsequent removal of substrate 20.

Figure 4:
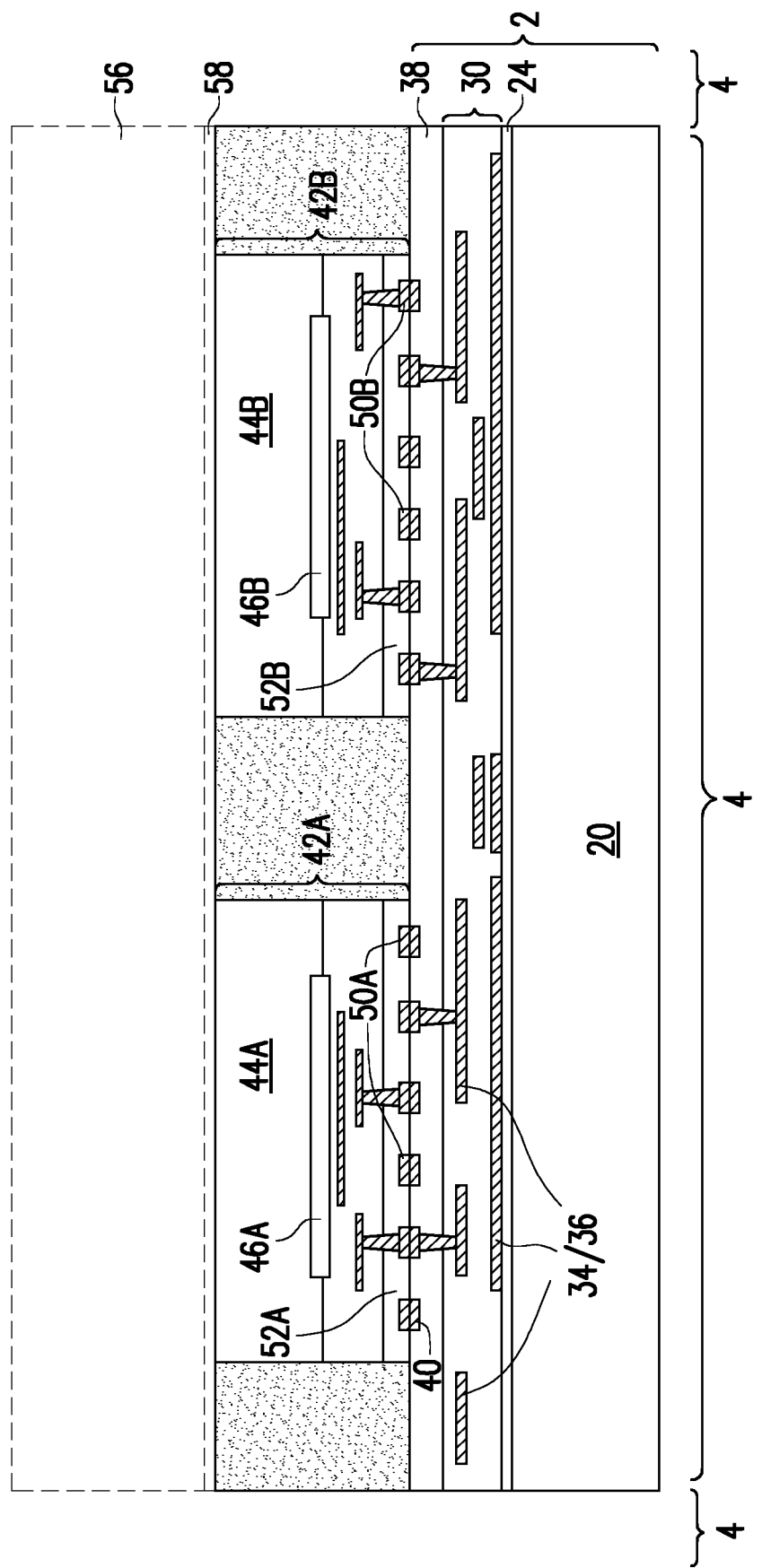

In accordance with some embodiments of the present disclosure, as shown in FIG. 4, device dies 42A and 42B and encapsulating material 54 are not thick enough. Supporting substrate 56 is attached to device dies 42A and 42B, and possibly encapsulating material 54 also. The respective process is illustrated as process 206 in the process flow 200 as shown in FIG. 17. Supporting substrate 56 may be a blank substrate formed of a homogenous material such as silicon, and no devices are formed on/in substrate 56. Supporting substrate 56 and substrates 44A/44B may be bonded through fusion bonding. In an example of the attachment, silicon oxide layer 58 is formed on the surface of substrate 56, for example, through thermal oxidation. Substrate 56 is then bonded to substrates 44A and 44B through silicon oxide layer 58, with Si—O—Si bonds formed between oxide layer 58 and substrates 44A/44B. Since encapsulating material 54 is not formed of oxide or silicon, oxide layer 58 may be in physical contact, but not bonded to, encapsulating material 54. In accordance with alternative embodiments, treatments are performed on substrates 56, 44A and 44B to form Si—OH bonds, and hence substrate 56 may be bonded to substrates 44A and 44B directly through fusion bonding.

Figure 5:
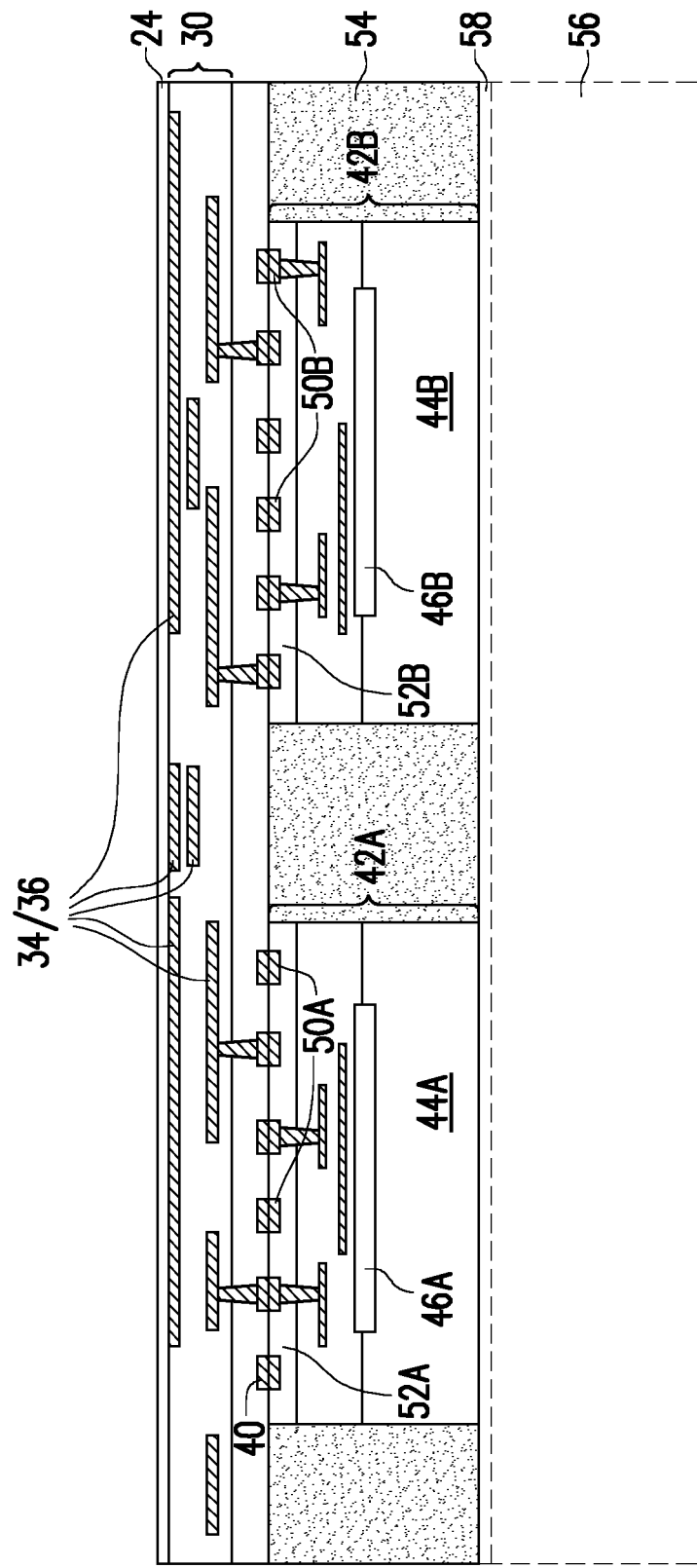

In accordance with alternative embodiments, supporting substrate 56 is attached to substrates 44A/44B through an adhesive film such as a Thermal Interface Material (TIM). In accordance with alternative embodiments, the process shown in FIG. 4 is skipped with no supporting substrate attached, and the process as shown in FIG. 5 is performed. Accordingly, substrate 56 and silicon oxide layer 58 are illustrated in subsequent figures as being dashed to indicate that they may or may not exist.

Next, the structure as shown in FIG. 4 (or FIG. 3 if the step in FIG. 4 is skipped) is flipped upside-down. Substrate 20 is then removed, for example, in a CMP process or a mechanical polishing process. The respective process is illustrated as process 208 in the process flow 200 as shown in FIG. 17. The resulting structure is shown in FIG. 5. In accordance with some embodiments of the present disclosure, the planarization is performed using dielectric layer 24 as a polish (CMP) stop layer. Accordingly, after the removal of substrate 20, dielectric layer 24 is exposed. In accordance with alternative embodiments, dielectric layer 24 is also removed, and metal lines/pads 34 are exposed. A dielectric layer may then be formed to cover metal lines/pads 34.

Figure 6:
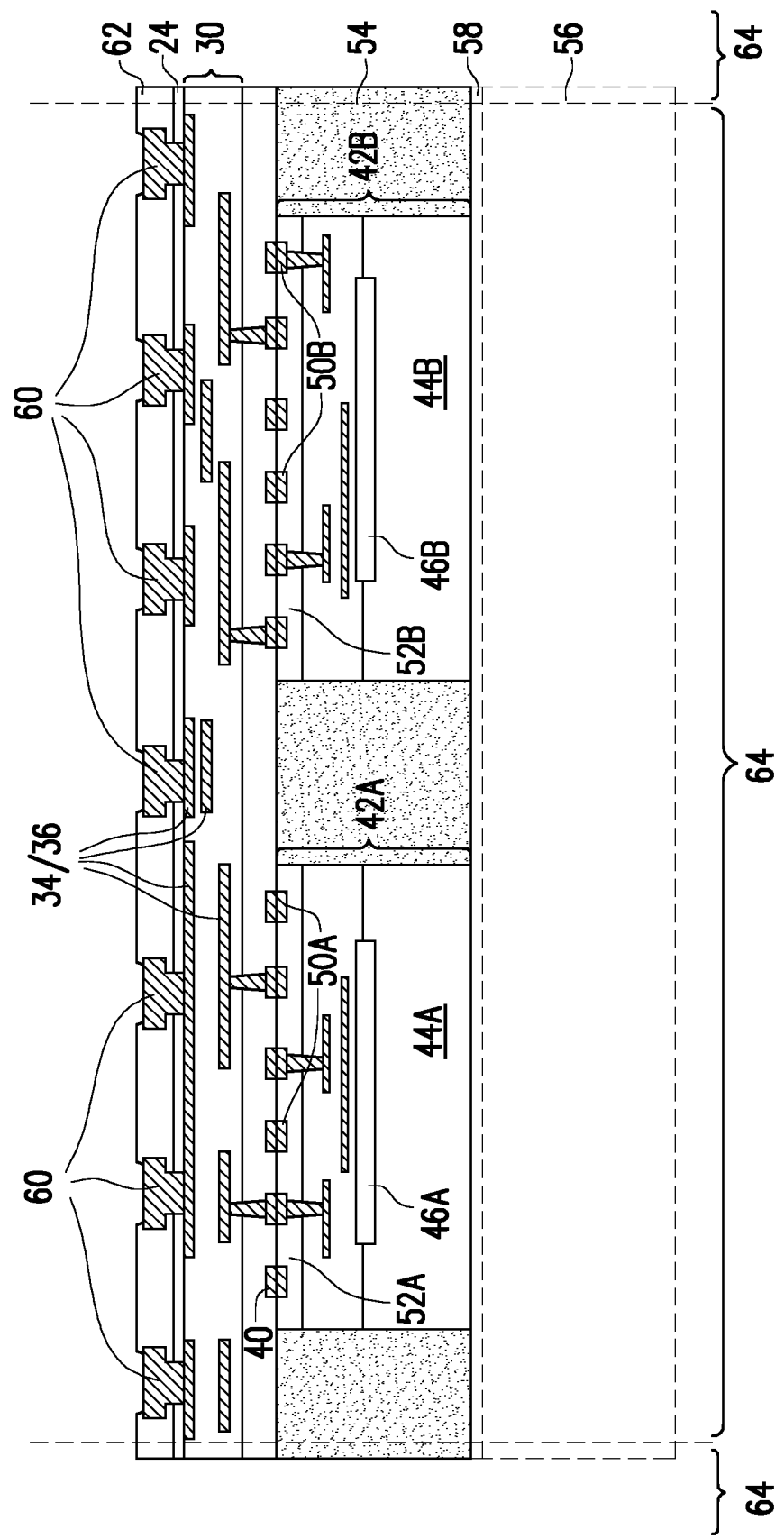

Referring to FIG. 6, conductive features 60 and dielectric layer 62 are formed. The respective process is illustrated as process 210 in the process flow 200 as shown in FIG. 17. Dielectric layer 62 may be formed of an inorganic material such as silicon, silicon nitride, or the like, or an organic material (such as a polymer), which may be PBO, polyimide, or the like. Conductive features 60 may be metal pads, Under-Bump-Metallurgies (UBMs), metal pillars, or the like, and may be formed of copper, titanium, nickel, aluminum, alloys thereof, and multi-layers thereof. A singulation may be performed, so that wafer 2 and the structures formed thereon are sawed into a plurality of packages 64 identical to each other. If supporting substrate 56 is attached to the device dies 42A and 42B, supporting substrate 56 is also sawed into packages 64. The respective process is illustrated as process 212 in the process flow 200 as shown in FIG. 17. Packages 64 are also referred to as device packages, or SoIC-H packages since dies 42A and 42B are horizontally allocated at a same level. The remaining portions of dies 4 in packages 64 in combination with dielectric layer 62 and conductive features 60 are referred to as interposers 4 hereinafter.

FIGS. 7 through 12 illustrate cross-sectional views of intermediate stages in the formation of a SoIC-H package in accordance with some embodiments of the present disclosure. The respective process is illustrated as process 214 in the process flow 200 as shown in FIG. 17. Unless specified otherwise, the materials and the formation methods of the components in these embodiments are essentially the same as the like components, which are denoted by like reference numerals in the embodiments shown in FIGS. 1 through 6. The details regarding the formation process and the materials of the components shown in FIGS. 7 through 12 may thus be found in the discussion of the embodiment shown in FIGS. 1 through 6.

Figure 7:
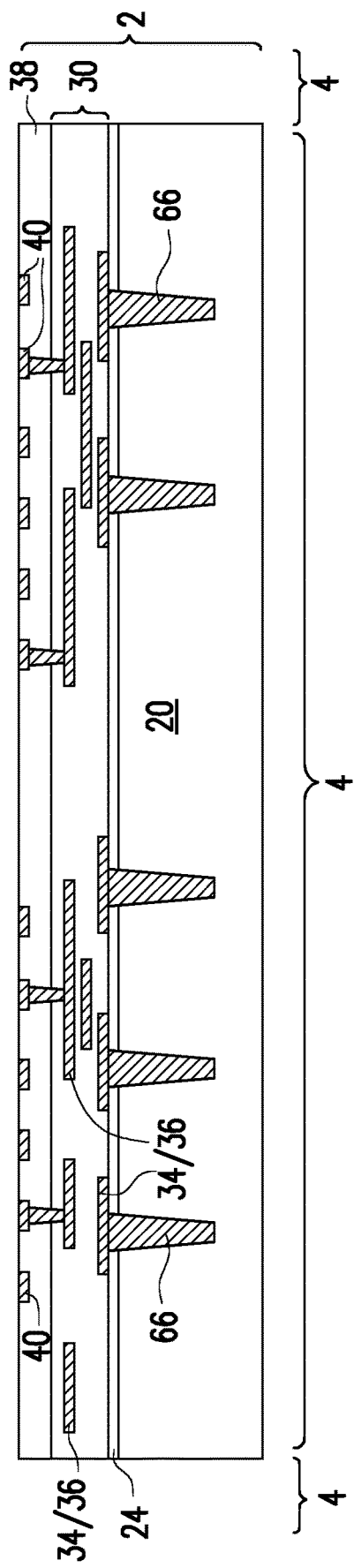
FIGS. 7 through 12 are cross-sectional views of intermediate stages in the formation of a SoIC-H package in accordance with some embodiments.

The embodiments as shown in FIGS. 7 through 12 are similar to the embodiments shown in FIGS. 1 through 6, with additional Through-Substrate-Vias (TSVs) 66 formed. Referring to FIG. 7, wafer 2 is formed, with TSVs 66 formed to extend into substrate 20. TSVs 66 are electrically connected to the metal lines 34 and vias 36 in interconnect structure 30. The remaining components as shown in FIG. 7 may be similar to what are discussed referring to FIG. 1, and hence are not discussed again.

Figure 8:
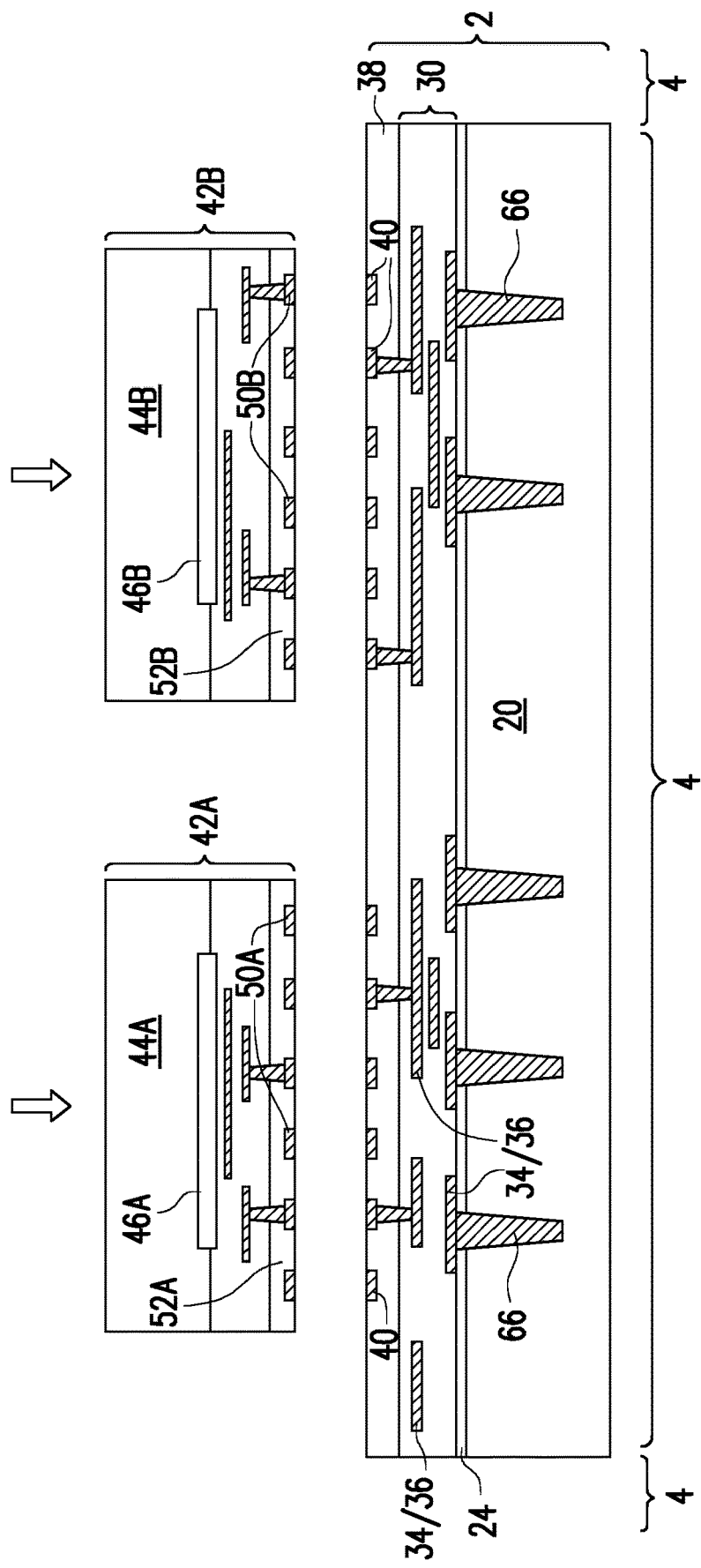
Figure 9:
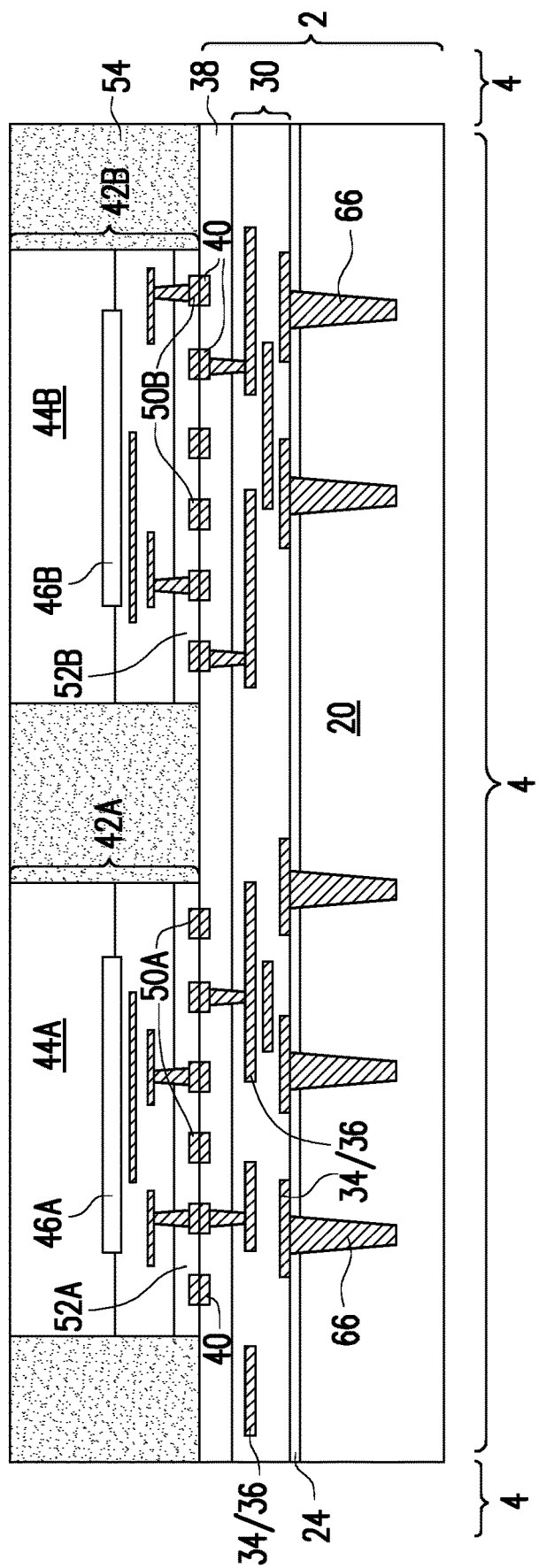

Referring to FIG. 8, device dies 42A and 42B are bonded to die 4 through hybrid bonding. The details of device dies 42A and 42B and the bonding process are not repeated herein. Next, referring to FIG. 9, device dies 42A and 42B are encapsulated in encapsulating material 54, followed by a planarization process to remove excess portions of encapsulating material 54. Substrates 44A and 44B are thus exposed, which have top surfaces coplanar with the top surface of encapsulating material 54. Again, the planarization may be stopped as soon as substrates 44A and 44B are exposed.

Figure 10:
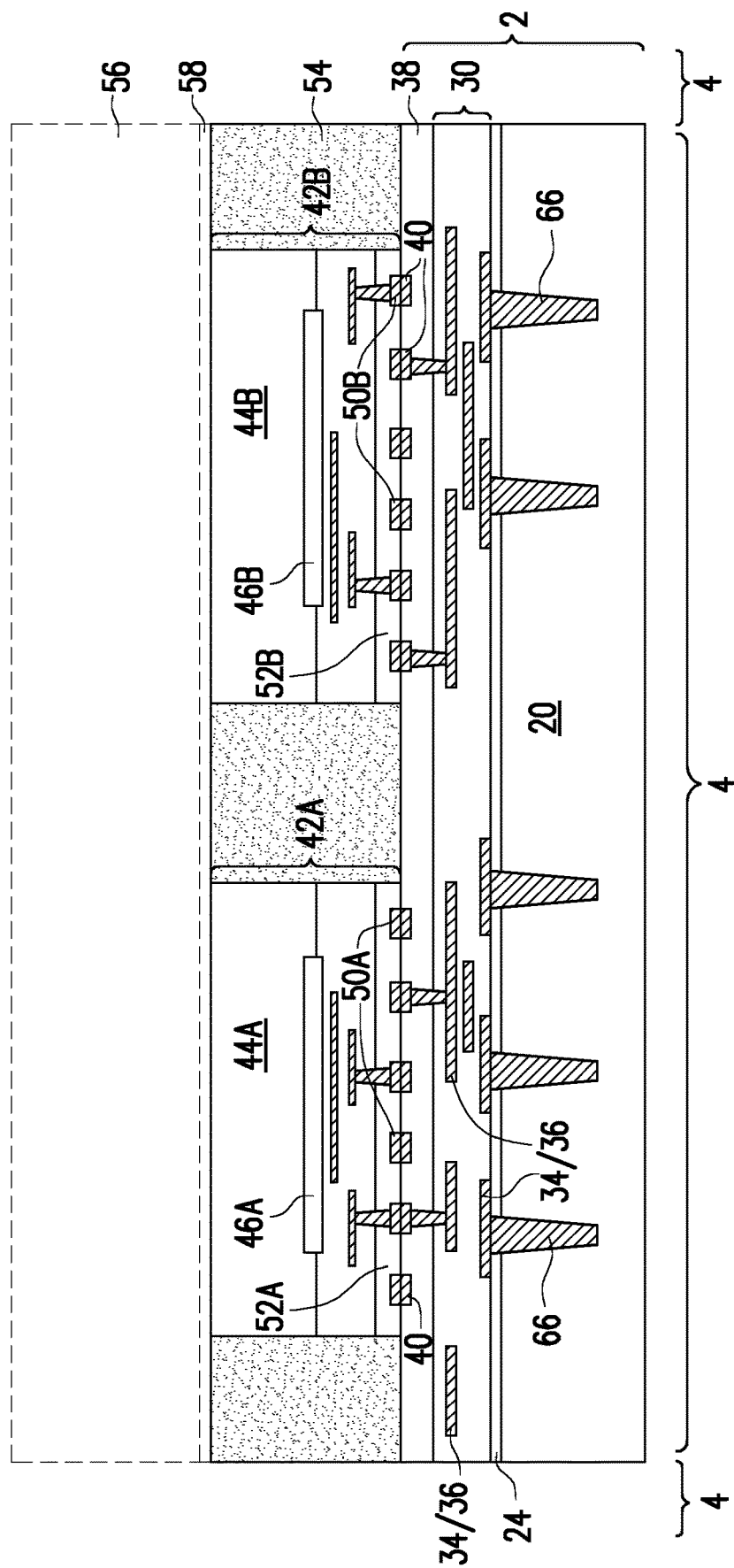

Referring to FIG. 10, in accordance with some embodiments of the present disclosure, supporting substrate 56, which may be formed of silicon, is attached to device dies 42A and 42B and encapsulating material 54 through layer 58. In accordance with some embodiments of the present disclosure, supporting substrate 56 is a silicon substrate, and layer 58 is an oxide layer, and is bonded to substrates 44A and 44B through fusion bonding, with Si—O—Si bonds formed between silicon oxide layer 58 and substrates 44A/44B. In accordance with alternative embodiments of the present disclosure, layer 58 is an adhesive layer such as a TIM. In accordance with yet alternative embodiments, supporting substrate 56 is a silicon substrate, and is directly bonded to substrates 44A and 44B through fusion bonding.

Figure 11:
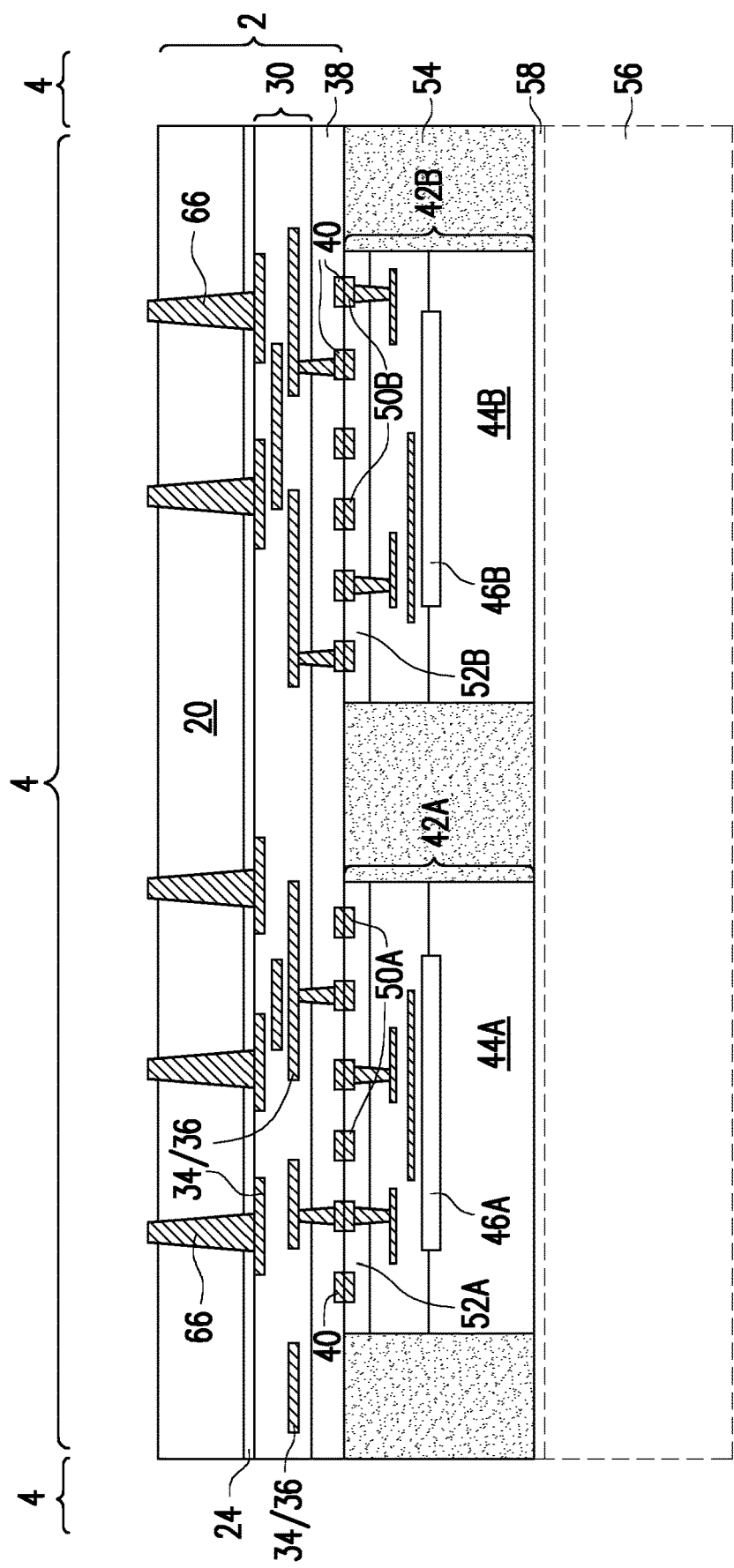
Figure 12:
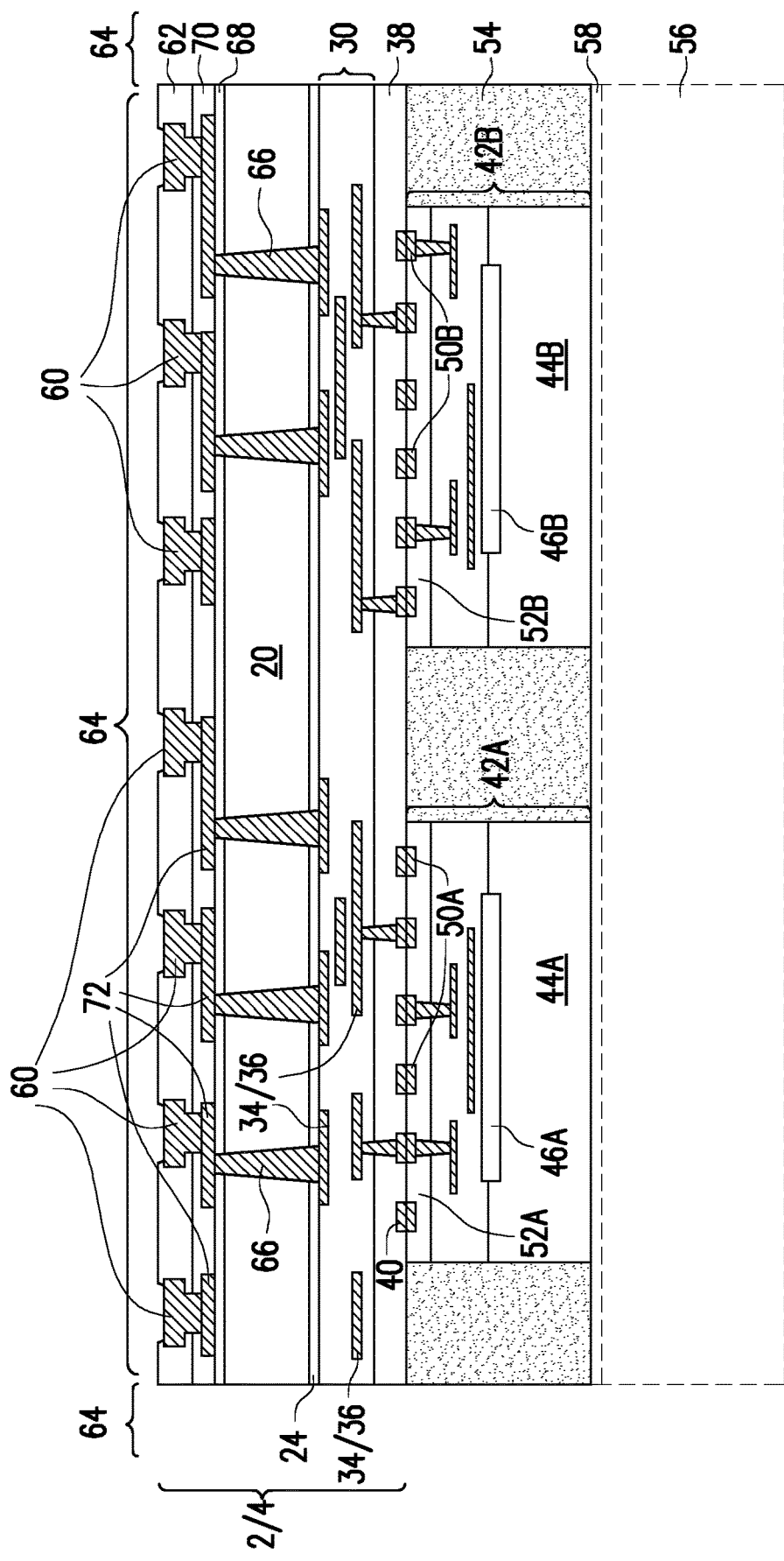

The structure shown in FIG. 10 is then flipped upside-down, and substrate 20 is thinned, until TSVs 66 are exposed. The resulting structure is shown in FIG. 11. TSVs 66 may also protrude slightly higher than the top surface of remaining substrate 20. Next, referring to FIG. 12, dielectric layers 68 and 70 are formed, and redistribution lines (RDLs) 72 are formed in dielectric layers 68 and 70 to electrically couple to TSVs 66. Dielectric layers 68 and 70 may be formed of an inorganic material such as silicon, silicon nitride, or the like, or an organic material (such as a polymer), which may be polybenzoxazole (PBO), polyimide, or the like. Dielectric layer 62 and conductive feature 60 are also formed to electrically connect to RDLs 72.

A singulation may be performed, so that wafer 2 and the structures formed thereon are sawed into a plurality of SoIC-H packages 64, which are identical to each other. The remaining portions of dies 4 and the overlying structures are in combination referred to as interposers 4 hereinafter. If supporting substrate 56 is attached to the device dies 42A and 42B, supporting substrate 56 is also sawed into SoIC-H packages 64.

Figure 13A:
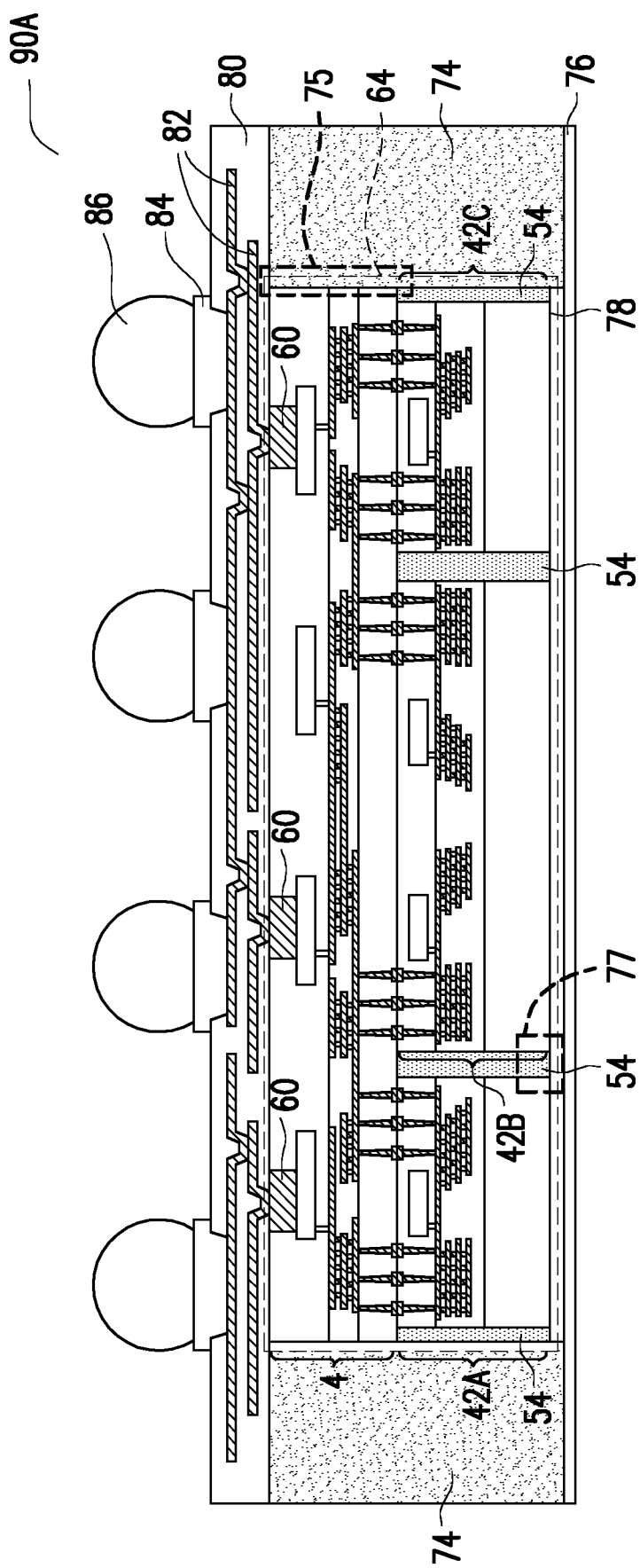
FIGS. 13A, 13B, 13C, 13D, 13E, 13F, and 13G illustrate the cross-sectional views of packages including built-in SoIC-H packages in accordance with some embodiments.

FIGS. 13A, 13B, 13C, 13D, 13E, 13F, and 13G illustrate the cross-sectional views of some packages formed based on SoIC-H packages 64 in accordance with some embodiments of the present disclosure. SoIC-H packages 64 are built in Integrated Fan-out (InFO) packages. SoIC-H packages 64 are illustrated schematically in FIGS. 13A, 13B, 13C, 13D, 13E, 13F, and 13G, and the details of SoIC-H packages 64 may be found referring to FIGS. 6 and 12. Each of SoIC-H packages 64 in FIGS. 13A, 13B, 13C, 13D, 13E, 13F, and 13G may have the structure shown in either one of FIGS. 6 and 12. In subsequent discussion, a brief process for forming the package as shown in FIG. 13A is discussed, and the same process may also be applied for forming the structures shown in FIGS. 13B, 13C, 13D, 13E, 13F, and 13G.

In a formation process of the structure shown in FIG. 13A, dielectric buffer layer 76 is first formed on a release film (not shown), which is further coated on a carrier (not shown). The carrier is a transparent carrier, which may be formed of glass. The release film may be a Light-To-Heat-Conversion (LTHC) coating, which decomposes under the heat of radiation such as a laser beam, and hence is used to separate the structure formed thereon from carrier. Dielectric buffer layer 76 may be formed of an organic material (a polymer, for example) such as PBO or polyimide, or an inorganic material such as silicon oxide, silicon nitride, or the like.

In accordance with some embodiments of the present disclosure, SoIC-H package 64 is attached to dielectric buffer layer 76 through Die-Attach Film (DAF) 78, which is an adhesive film. The edges of DAF 78 may be flushed with the respective edges of SoIC-H package 64. The packaging process may be performed at wafer level, with a plurality of SoIC-H packages 64 being placed on dielectric buffer layer 76. After the placement of SoIC-H packages 64, encapsulating material 74 is dispensed and cured, followed by a planarization process such as a CMP process or a mechanical grinding process. As a result of the planarization process, the top surface of SoIC-H package 64 is coplanar with the top surface of encapsulating material 74.

Figure 16:
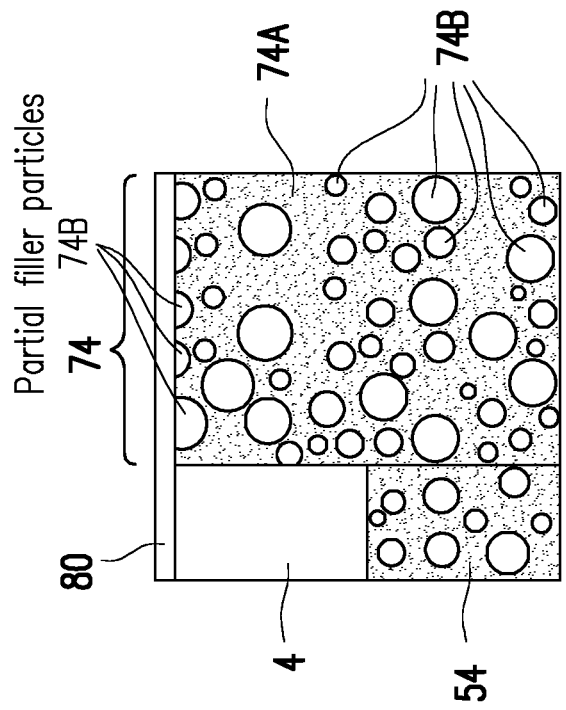
FIGS. 15 and 16 illustrate some details of some portions of encapsulating materials in accordance with some embodiment.

FIG. 16 schematically illustrates a top portion of encapsulating material 74 in region 75 as shown in FIG. 13A. As shown in FIG. 16, encapsulating material 74 may include base material 74A, which may be a polymer, a resin, an epoxy, or the like, and filler particles 74B in the base material 74A. The polymer may be a carbon-based polymer. The filler particles 74B may be particles of a dielectric material(s) such as $SiO_2$, $Al_2O_3$, silica, the compound of iron (Fe), the compound of sodium (Na), or the like, and may have spherical shapes. Also, the spherical filler particles 74B may have the same or different diameters, as illustrated in FIG. 16 accordance with some examples.

FIG. 15 illustrates a bottom portion of encapsulating material 54 in region 77 as shown in FIG. 13A. Comparing FIGS. 15 and 16, it is appreciated that in FIG. 15, partial filler particles 54B are at the bottom, which may contact DAF 78, while in FIG. 16, partial filler particles 74B are at the top, which may contact dielectric layer 80.

Encapsulating materials 54 and 74 may be the same or different from each other. For example, encapsulating material 54 is under interposer 4, and hence its CTE significantly affects the warpage of the resulting package, especially when interposer 4 includes silicon substrate therein (refer to FIG. 13B). On the other hand, encapsulating material 74 fully surrounds both interposer 4 and device dies 42A, 42B, and 42C, and hence its CTE has a smaller effect (in causing warpage) than encapsulating material 54. Accordingly, the selection of encapsulating material 54 is more restrictive, and may be selected to have a small CTE. Encapsulating material 74 may be selected according to other criteria such as lower cost. Accordingly, encapsulating material 74 may have a CTE greater than the CTE of encapsulating material 54.

After the encapsulation and the planarization, dielectric layers 80 are formed, which may be formed of an organic material (a polymer, for example) such as PBO or polyimide, or an inorganic material such as silicon oxide, silicon nitride, or the like. RDLs 82 are formed in dielectric layers 80, and are electrically coupled to conductive features 60 in SoIC-H package 64. UBMs 84 and electrical connectors 86 (such as solder regions) are then formed. In subsequent processes, the structure shown in FIG. 13A is de-bonded from the underlying release film (not shown) and carrier (not shown), for example, by projecting a laser beam to decompose the release film. A singulation is then performed to form a plurality of identical packages, each including one of the SoIC-H packages 64. The resulting package is referred to as package 90A. In the singulation, buffer dielectric layer 76, encapsulating material 74, and dielectric layers 80 are sawed.

Figure 13B:
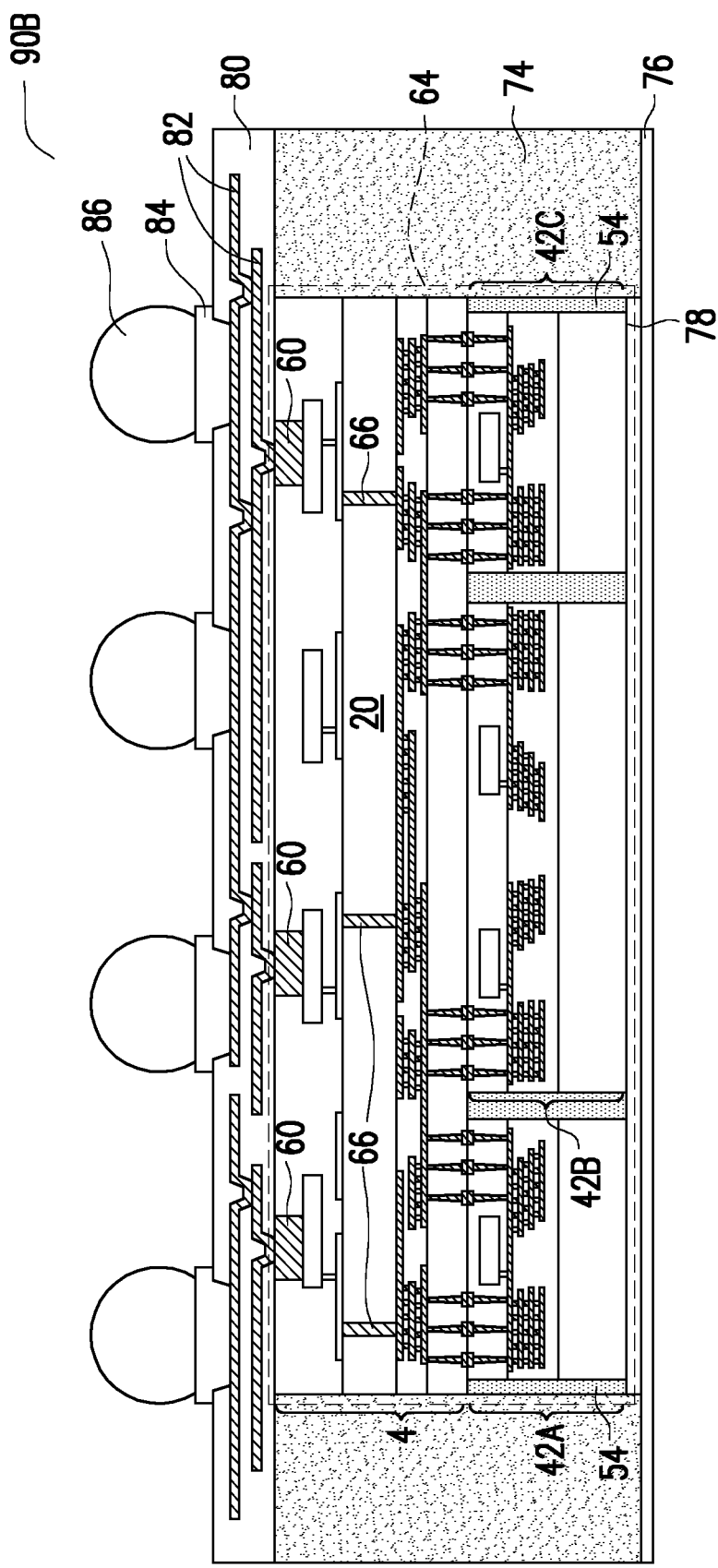

FIG. 13B illustrates package 90B formed in accordance with some embodiments of the present disclosure, with SoIC-H package 64 embedded therein. These embodiments are similar to the embodiments shown in FIG. 13A, except that interposer 4 includes semiconductor substrate 20, and through-vias 66 penetrating through semiconductor substrate 20. The details of substrate 20 and through-vias 66 may be found referring to the discussion of the embodiments in FIGS. 6 through 12.

Figure 13C:
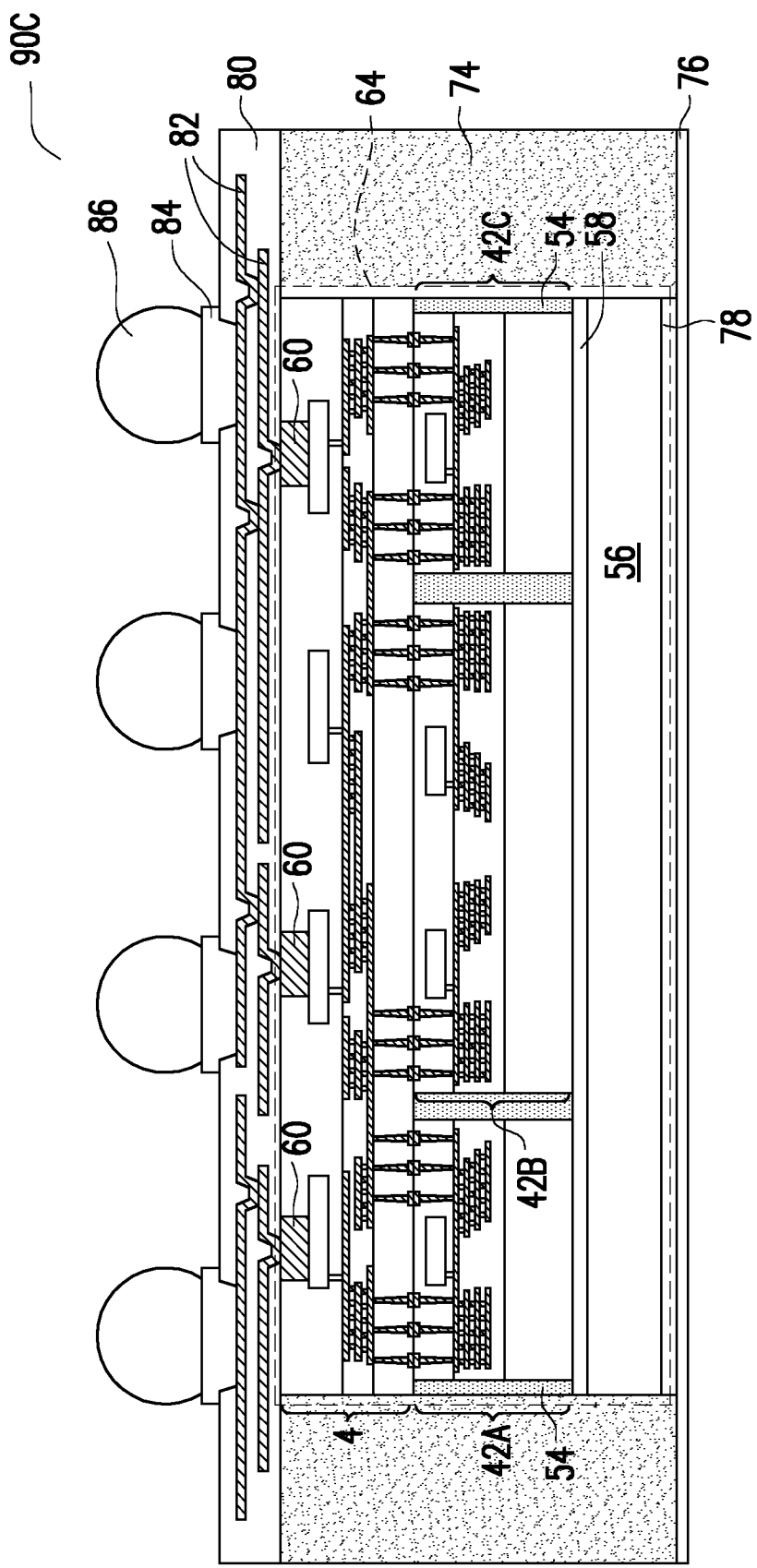

FIG. 13C illustrates package 90C formed in accordance with some embodiments of the present disclosure, with SoIC-H package 64 embedded therein. These embodiments are similar to the embodiments shown in FIG. 13A, except that SoIC-H package 64 includes supporting substrate 56, and supporting substrate 56 is in contact with DAF 78. The details of supporting substrate 56 may be found referring to the discussion of the embodiments in FIGS. 1 through 12.

Figure 13D:
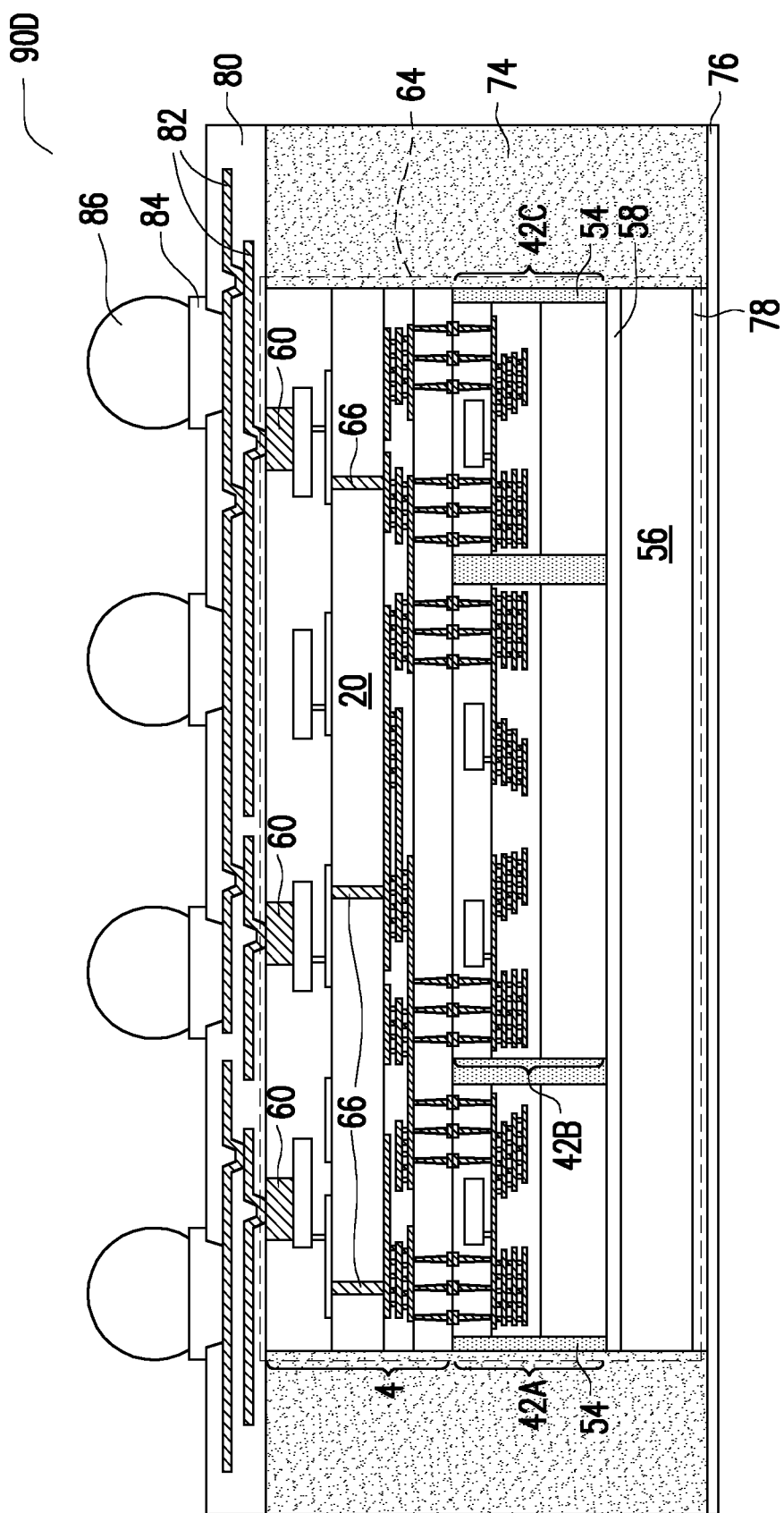

FIG. 13D illustrates package 90D formed in accordance with some embodiments of the present disclosure, with SoIC-H package 64 embedded therein. These embodiments are similar to the embodiments shown in FIG. 13A, except that interposer 4 includes semiconductor substrate 20, and through-vias 66 penetrating through semiconductor substrate 20. Furthermore, supporting substrate 56 is in SoIC-H package 64, and is in contact with DAF 78. The details of substrate 20, through-vias 66, and supporting substrate 56 may be found referring to the discussion of FIG. 12.

Figure 13E:
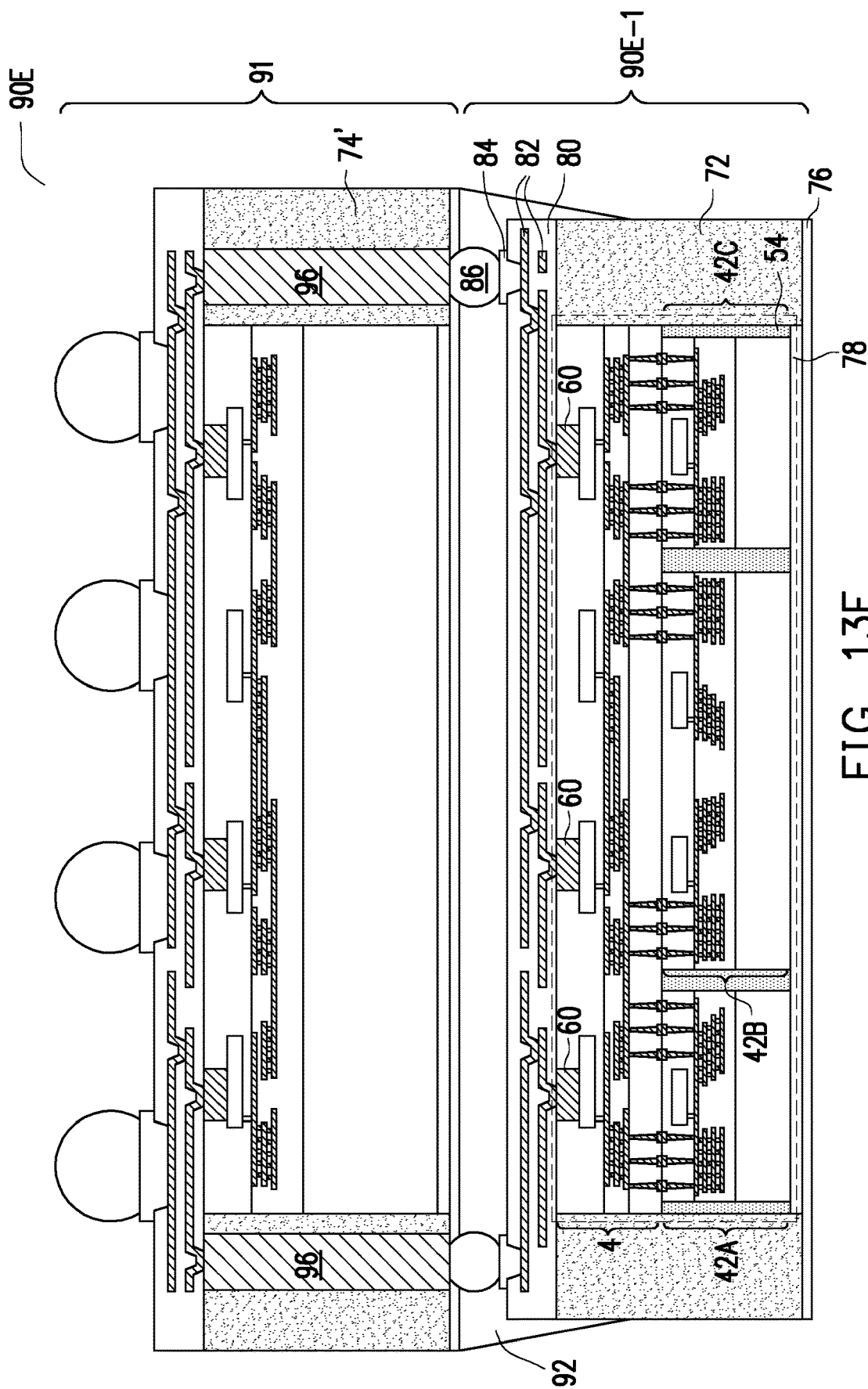

FIG. 13E illustrates package 90E formed in accordance with some embodiments of the present disclosure, with SoIC-H package 64 embedded therein. These embodiments are similar to the embodiments shown in FIG. 13A, except that an additional InFO package 91 is bonded to package 90E-1. Package 90E-1, although illustrated as having the structure of package 90A in an example, may have any other structures of packages 90B (FIG. 13B), 90C (FIG. 13C), or 90D (FIG. 13D) also. InFO package 91 may include encapsulating material 74', and through-vias 96 penetrating through encapsulating material 74'. Underfill 92 is disposed between packages 91 and 90E-1

Figure 13F:
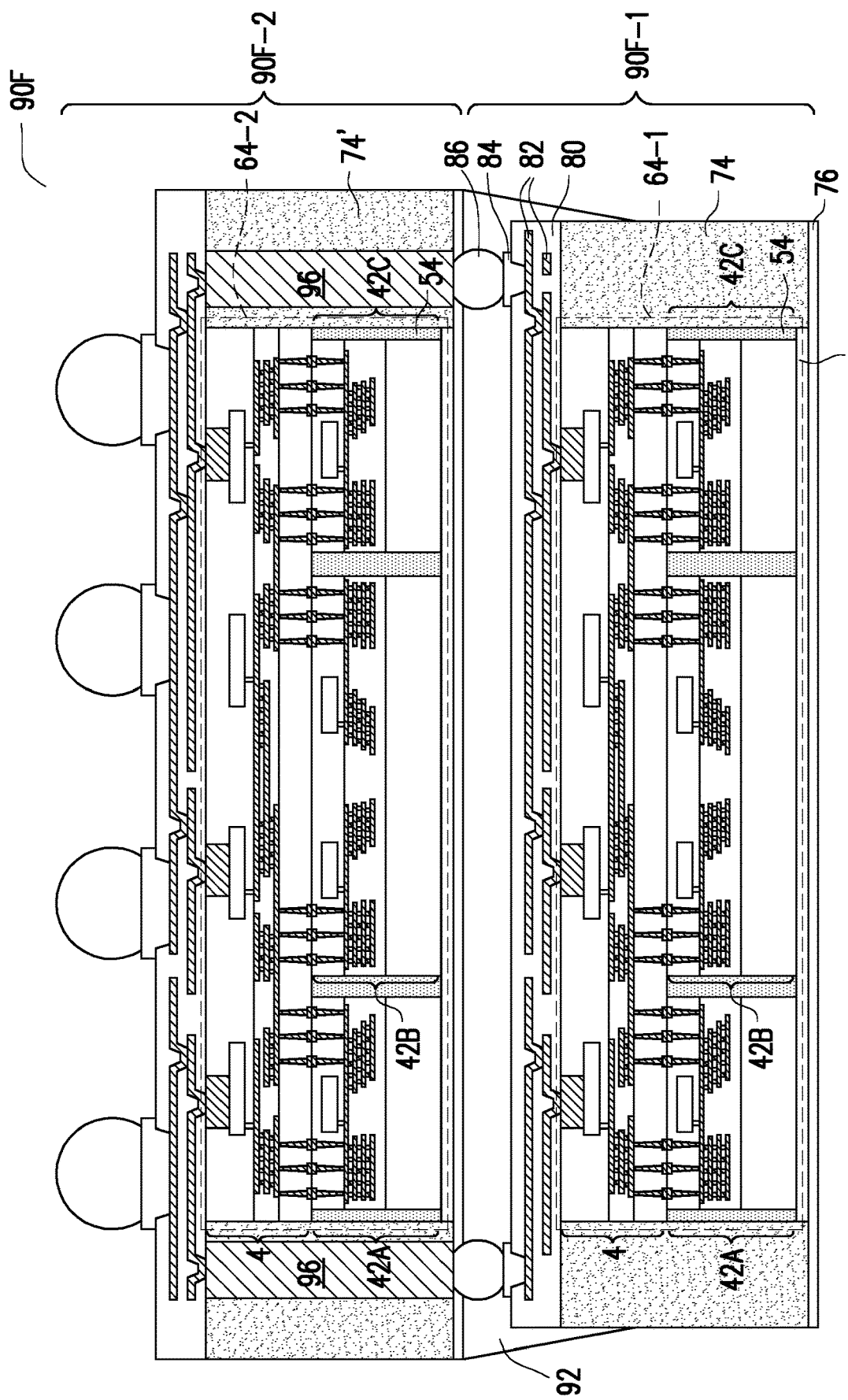

FIG. 13F illustrates package 90F formed in accordance with some embodiments of the present disclosure, with SoIC-H package 64 embedded therein. These embodiments are similar to the embodiments shown in FIG. 13A, except that an additional InFO package 90E-2 is bonded to package 90E-1, each having a SoIC-H package 64 (marked as 64-1 and 64-2 in order to distinguish). Each of SoIC-H packages 90E-1 and 90-F2 may have a structure selected from package 90A (FIG. 13A), package 90B (FIG. 13B), package 90C (FIG. 13C), or package 90D (FIG. 13D). InFO package 90E-2 may include encapsulating material 74', and through-vias 96 in encapsulating material 74'. Underfill 92 is disposed between packages 91 and 90D-1

Figure 13G:
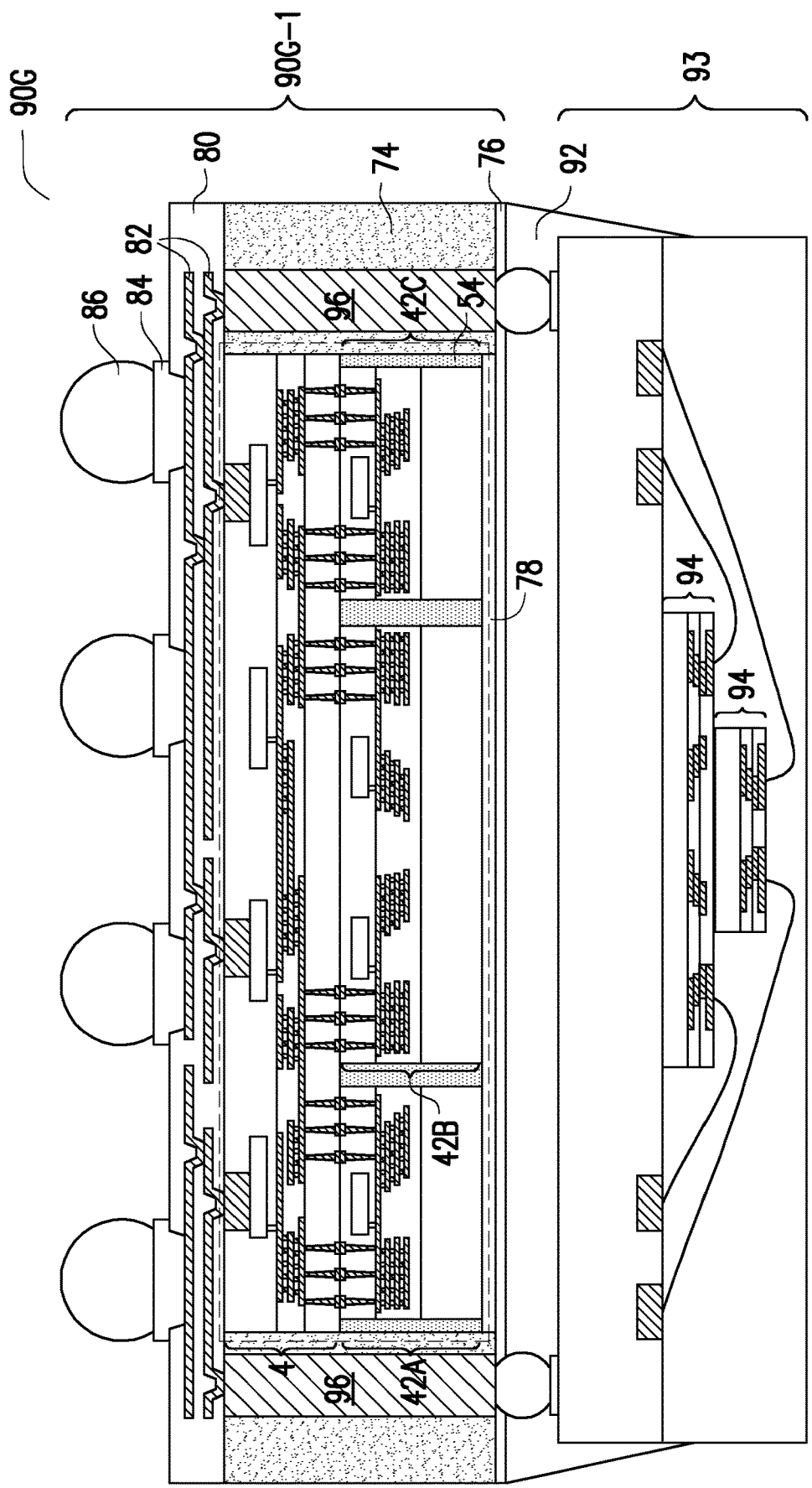

FIG. 13G illustrates package 90G formed in accordance with some embodiments of the present disclosure, with SoIC-H package 64 embedded therein. These embodiments are similar to the embodiments shown in FIG. 13A, except that through-vias 96 is formed in package 90G-1, and penetrating through encapsulating material 74. An additional package 93 is bonded to package 90G-1. Package 93 may include memory dies 94 therein, which may be Dynamic Random Access Memory (DRAM) dies.

In above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present application have some advantageous features. SoIC-H packages are formed and integrated into other packages, improving the integration level of the resulting packages. Furthermore, planarization processes typically have high cost. However, in the gap-filling processes as in FIGS. 3 and 9, if device dies are not thinned through planarization, it is difficult to fill in oxide because oxide typically cannot be used to fill gaps deeper than about 30 µm. In accordance with some embodiments of the present disclosure, molding compound may be used to fill deep gaps to avoid the planarization process for thinning device dies.

In accordance with some embodiments of the present disclosure, a method includes forming an interposer, which includes a semiconductor substrate, and an interconnect structure over the semiconductor substrate. The method further includes bonding a device die to the interposer, so that a first metal pad in the interposer is bonded to a second metal pad in the device die, and a first surface dielectric layer in the interposer is bonded to a second surface dielectric layer in the device die. The method further includes encapsulating the device die in an encapsulating material, forming conductive features over and electrically coupling to the device die, and removing the semiconductor substrate. A part of the interposer, the device die, and portions of the conductive features in combination form a package. In an embodiment, the method further comprises attaching a supporting substrate to the device die, wherein the supporting substrate forms a part of the package. In an embodiment, the supporting substrate is a blank semiconductor substrate. In an embodiment, the method further comprises sawing the interposer and the first encapsulating material as packages separated from each other, with the package being one of the packages, wherein in the sawing, the supporting substrate is sawed through. In an embodiment, the method further comprises encapsulating the package in a second encapsulating material; and forming redistribution lines over and electrically coupling to the package. In an embodiment, the first encapsulating material and the second encapsulating material have different CTEs. In an embodiment, the method further comprises performing a die saw to saw the second encapsulating material. In an embodiment, no thinning is performed on the device die before the first encapsulating material is encapsulated.

In accordance with some embodiments of the present disclosure, a method comprises forming an interposer wafer comprising a semiconductor substrate; and an interconnect structure over the semiconductor substrate; bonding a plurality of device dies to the interposer wafer, wherein first metal pads in the interposer wafer are bonded to second metal pads in the device dies, and a first surface dielectric layer in the interposer wafer is bonded to second surface dielectric layers in the device dies; encapsulating the device dies in a first encapsulating material; forming conductive features over and electrically coupling to the device dies; sawing the interposer wafer and the first encapsulating material to form a plurality of packages; encapsulating one of the packages in a second encapsulating material; forming redistribution lines overlapping the second encapsulating material and the one of the packages to form an InFO package; and sawing the second encapsulating material to form an additional plurality of packages. In an embodiment, the method further comprises attaching a supporting substrate to the device dies, wherein when the interposer wafer is sawed, the supporting substrate is sawed into the plurality of packages. In an embodiment, the supporting substrate comprises a silicon substrate, and the silicon substrate is bonded to substrates of the plurality of device dies through hybrid bonding. In an embodiment, the first encapsulating material and the second encapsulating material have different CTEs. In an embodiment, no thinning is performed on the device dies before the first encapsulating material is encapsulated. In an embodiment, the method further comprises removing the semiconductor substrate of the interposer wafer before the sawing. In an embodiment, the interposer wafer comprises through-vias in the semiconductor substrate, and the method further comprises, before the redistribution lines are formed, polishing the semiconductor substrate to reveal the through-vias, wherein the redistribution lines are electrically coupled to the through-vias.

In accordance with some embodiments of the present disclosure, a package comprises a SoIC-H package (a device pacakge) comprising: an interposer; a device die underlying and bonded to the interposer; a first encapsulating material encapsulating the device die therein, wherein the first encapsulating material is overlapped by a portion of the interposer; a second encapsulating material encapsulating the SoIC-H package therein; at least one dielectric layer overlapping the second encapsulating material and the SoIC-H package; and conductive features in the at least one dielectric layer, wherein the conductive features are electrically coupled to the device die through the interposer. In an embodiment, a first metal pad in the interposer is bonded to a second metal pad in the device die through metal-to-metal direct bonding, and a first surface dielectric layer in the interposer is bonded to a second surface dielectric layer in the device die through fusion bonding. In an embodiment, the package further comprises a supporting substrate underlying and bonded to a semiconductor substrate of the device die. In an embodiment, the package further comprises a dielectric buffer layer underlying and contacting the second encapsulating material. In an embodiment, the package further comprises an adhesive film over and contacting the dielectric buffer layer, wherein the adhesive film has edges flushed with edges of the SoIC-H package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising: a device package comprising:
   an interposer comprising a first portion, and the first portion comprises a first edge;
   a device die underlying and bonded to the interposer;
   a first encapsulating material encapsulating the device die therein, wherein the first encapsulating material comprises a second portion overlapped by the first portion of the interposer, and wherein the second portion comprises a second edge flush with the first edge of the interposer;
   a second encapsulating material encapsulating the device package therein; at least one dielectric layer overlapping the second encapsulating material and the device package, wherein a bottom surface of the at least one dielectric layer forms an interface with a topmost surface of the second encapsulating material, wherein the interface is a horizontal interface; and
   conductive features in the at least one dielectric layer, wherein the conductive features are electrically coupled to the device die through the interposer.

2. The package of claim 1, wherein a first metal pad in the interposer is bonded to a second metal pad in the device die, and a first surface dielectric layer in the interposer is bonded to a second surface dielectric layer in the device die.

3. The package of claim 1 further comprising a supporting substrate underlying a semiconductor substrate of the device die, wherein an entirety of the supporting substrate is a blank substrate formed of a homogeneous material.

4. The package of claim 3 further comprising an additional dielectric layer on the supporting substrate, wherein the additional dielectric layer is bonded to the semiconductor substrate of the device die through Si—O—Si bonds, and wherein the additional dielectric layer comprises a third edge underlying and flush with the first edge and the second edge.

5. The package of claim 4, wherein the additional dielectric layer is in physical contact with, and is not bonded to, the first encapsulating material.

6. The package of claim 4, wherein the additional dielectric layer comprises silicon oxide, and the first encapsulating material comprises a molding compound.

7. The package of claim 1 further comprising a polymer layer underlying and contacting the second encapsulating material.

8. The package of claim 7 further comprising an adhesive film over and contacting the polymer layer, wherein the adhesive film has edges flushed with edges of the device package.

9. A package comprising:
   a supporting substrate, wherein the supporting substrate is free from conductive features therein;
   a silicon oxide layer over and physically contacting the supporting substrate;
   a device die over the silicon oxide layer, wherein the device die comprises a silicon substrate, and the silicon substrate is bonded to, and is in physical contact with, the silicon oxide layer, wherein Si—O—Si bonds are formed between the silicon substrate and the silicon oxide layer;
a first encapsulant encapsulating the device die therein; and
an interposer over and bonded with the device die.

10. The package of claim 9, wherein the interposer comprises:
a semiconductor substrate; and
a through-via penetrating through the semiconductor substrate.

11. The package of claim 9, wherein the supporting substrate comprises a blank substrate free from integrated circuits devices thereon.

12. The package of claim 9, wherein the silicon oxide layer is in physical contact with the first encapsulant, with no bonds formed between the silicon oxide layer and the first encapsulant.

13. The package of claim 9 further comprising:
a second encapsulant encapsulating both of the device die and the interposer therein.

14. The package of claim 13, wherein the second encapsulant further encapsulates the supporting substrate therein.

15. A package comprising:
an interposer;
a first device die and a second device die underlying and bonded to the interposer, wherein both of the first device die and the second device die are in physical contact with the interposer;
a supporting substrate underlying and bonded to the first device die and the second device die, respectively, wherein the supporting substrate is a blank substrate formed of a homogeneous material;
a first encapsulant encapsulating the first device die and the second device die; and
a second encapsulant encapsulating the interposer, the supporting substrate, and the first encapsulant therein.

16. The package of claim 15 further comprising a die-attach film underlying and adhering to the supporting substrate therein, wherein the die-attach film comprises edges flush with respective edges of the first encapsulant.

17. The package of claim 15, wherein the supporting substrate is free from additional features formed of materials different from the homogeneous material.

18. The package of claim 15, wherein a portion of the interposer overlaps a portion of the first encapsulant, with a first edge of the interposer over and flushing with a second edge of the first encapsulant.

19. The package of claim 15, wherein the homogeneous material comprises silicon.

20. The package of claim 1, wherein the second encapsulating material comprises a third edge contacting the second edge of the first encapsulating material to form a vertical interface, and a fourth edge, wherein the third edge and the fourth edge are opposing edges of the second encapsulating material, and wherein the fourth edge is parallel to the third edge.

* * * * *